(12) United States Patent
Chen et al.

(10) Patent No.: US 8,993,697 B2
(45) Date of Patent: Mar. 31, 2015

(54) CONDUCTING AND SEMICONDUCTING ORGANIC MATERIALS

(71) Applicant: Commonwealth Scientific and Industrial Research Organisation, Campbell (AU)

(72) Inventors: Ming Chen, Burwood (AU); Graeme Moad, Sassafras (AU); Ezio Rizzardo, Wheelers Hill (AU); Richard Alexander Evans, Glen Waverly (AU); Matthias Haeussler, Brunswick (AU)

(73) Assignee: Commonwealth Scientific and Industrial Research Institute Organisation, Campbell (AU)

( * ) Notice: Subject to any disclaimer, the term of this patent is extended or adjusted under 35 U.S.C. 154(b) by 0 days.

(21) Appl. No.: 13/931,046

(22) Filed: Jun. 28, 2013

(65) Prior Publication Data

US 2013/0289217 A1 Oct. 31, 2013

Related U.S. Application Data

(62) Division of application No. 13/000,983, filed as application No. PCT/AU2009/000818 on Jun. 25, 2009, now Pat. No. 8,501,889.

(60) Provisional application No. 61/075,944, filed on Jun. 26, 2008.

(51) Int. Cl.
*C08F 28/06* (2006.01)
*C08F 26/06* (2006.01)
(Continued)

(52) U.S. Cl.
CPC ...... *H01B 1/127* (2013.01); *C08F 2/38* (2013.01); *C08F 4/00* (2013.01); *C08F 291/00* (2013.01);
(Continued)

(58) Field of Classification Search
CPC ........... C08F 2/38; C08F 4/00; C08F 291/00; C08F 293/005; C08L 51/003; C08L 53/00; H01L 51/0043; H01L 51/0036; H01L 51/0053; H01L 51/0068
USPC ........ 526/256, 258, 266, 348; 525/69, 64, 67, 525/68

See application file for complete search history.

(56) References Cited

U.S. PATENT DOCUMENTS 7,649,048 B2 * 1/2010 Lutsen et al. ................ 525/69
2003/0195310 A1 10/2003 McCormick et al.
2005/0187364 A1 8/2005 Herron et al.

FOREIGN PATENT DOCUMENTS

EP 1205492 A1 5/2002
WO 98/01478 A1 1/1998
(Continued)

OTHER PUBLICATIONS

International Search Report for Application No. PCT/AU2009/000818, 4 pages, dated Jul. 24, 2009.

*Primary Examiner* — William Cheung
(74) *Attorney, Agent, or Firm* — Nelson Mullins Riley & Scarborough LLP; Anthony A. Laurentano

(57) ABSTRACT

A polymer comprising a conducting or semiconducting segment coupled to a polymer segment having an insulating polymer backbone, the polymer further comprising a RAFT functional group coupled to the polymer segment, wherein there is no RAFT functional group in between the conducting or semiconducting segment and the polymer segment.

12 Claims, 5 Drawing Sheets

(51) Int. Cl.
- *C08F 24/00* (2006.01)
- *C08F 210/00* (2006.01)
- *C08G 63/48* (2006.01)
- *C08G 63/91* (2006.01)
- *H01B 1/12* (2006.01)
- *C08F 2/38* (2006.01)
- *C08F 4/00* (2006.01)
- *C08F 291/00* (2006.01)
- *C08F 293/00* (2006.01)
- *C08L 51/00* (2006.01)
- *C08L 53/00* (2006.01)
- *H01L 51/00* (2006.01)

(52) U.S. Cl.
CPC .......... *C08F 293/005* (2013.01); *C08L 51/003* (2013.01); *C08L 53/00* (2013.01); *H01B 1/12* (2013.01); *H01L 51/004* (2013.01); *H01L 51/0043* (2013.01); *H01L 51/0036* (2013.01); *C08F 2438/03* (2013.01); *H01L 51/0053* (2013.01); *H01L 51/0068* (2013.01); *C08F 2810/40* (2013.01)

USPC .......... 526/256; 526/258; 526/266; 526/348; 525/69; 525/64; 525/67; 525/68

(56) References Cited

FOREIGN PATENT DOCUMENTS

| WO | 01/77198 A1 | 10/2001 |
|----|-------------|---------|
| WO | 2007/025189 A2 | 3/2007 |

* cited by examiner

US 8,993,697 B2

CONDUCTING AND SEMICONDUCTING ORGANIC MATERIALS

RELATED APPLICATIONS

This application is a divisional application of U.S. application Ser. No. 13/000,983 filed Mar. 21, 2011, which is a 35 U.S.C. 371 national stage filing of International Application No. PCT/AU2009/000818, filed Jun. 25, 2009, now U.S. Pat. No. 8,501,889, which claims priority to U.S. Provisional Application No. 61/075,944 filed on Jun. 26, 2008 in the U.S. The contents of the aforementioned applications are hereby incorporated by reference.

FIELD OF THE INVENTION

The invention relates in general to conducting and semiconducting organic materials, and in particular to a polymer comprising a conducting or semiconducting segment. The invention further relates to organic compounds useful in the synthesis of organic conducting and semiconducting materials and processes for preparing organic conducting and semiconducting materials.

BACKGROUND OF THE INVENTION

Polymeric organic materials with the ability to conduct electricity were first characterised in the 1960s by D. E. Weiss and coworkers. In 2000 the Nobel Prize for Chemistry was awarded to Heeger, MacDiamid and Shirakawa for work in the field. Some organic materials are, of themselves, conducting whereas others only become conducting when subjected to one or more external stimuli. This second type of organic material is known as a semiconductor and is analogous to an inorganic semiconductor in that it may function as either an insulator or a conductor when subjected to one or more external stimuli.

Electrically conducting polymers have the potential to be used in miniaturised electronic components. In particular, organic semiconductors are presently used to form the active element in optoelectronic devices such as organic light-emitting diodes (OLED), organic solar cells, organic field effect transistors (OFET), electrochemical transistors and more recently has been applied to biosensing applications.

Despite recent advances in conducting polymer technology, the full potential of such polymers has not yet been realized in part due to difficulties associated with their processing. In particular, by virtue of their structure, conducting polymers typically exhibit poor physical and chemical properties that inhibit post manufacture processing. For example, the polymers are typically highly conjugated and rigid, which often means that the conducting polymers are intractable solids.

In this respect, desirable new applications for conducting polymers require conducting polymers with superior properties to those presently available. For example, the current state-of-the-art in organic solar cells uses a two component system to achieve efficient charge separation and transport. This system is, however, prone to change with temperature leading to aggregation and changes in device efficiencies. The synthesis of a single component material that cannot aggregate or phase separate is therefore an important area of research. Polymerisation techniques used to synthesise conventional, fully conjugated, semi-conducting polymers typically deliver polymers with a broad molecular weight distribution and offer little, if no, means of control.

Accordingly there remains a need to provide organic conducting or semiconducting materials with greater utility, such as those with improved chemical and physical properties including enhanced solubility.

SUMMARY OF THE INVENTION

In one aspect the invention provides a polymer comprising a conducting or semiconducting segment coupled to a polymer segment having an insulating polymer backbone, the polymer further comprising a RAFT functional group coupled to the polymer segment, wherein there is no RAFT functional group in between the conducting or semiconducting segment and the polymer segment.

In another aspect the invention provides a macro-RAFT agent for polymerising one or more ethylenically unsaturated monomers by RAFT polymerisation, the macro-RAFT agent having a conducting or semiconducting segment coupled to a RAFT functional group, wherein the leaving group of the macro-RAFT agent comprises the conducting or semiconducting segment.

In another aspect the invention provides a process for producing a polymer by RAFT polymerisation comprising polymerising one or more ethylenically unsaturated monomers under the control of a macro-RAFT agent, said macro-RAFT agent having a conducting or semiconducting segment coupled to a RAFT functional group, wherein the leaving group of the macro-RAFT agent comprises the conducting or semiconducting segment.

The present invention utilises a technique known as Reversible Addition Fragmentation Chain Transfer (RAFT) polymerisation (as described in WO9801478). Through use of RAFT polymerisation it has been discovered that a polymer segment having an insulating polymer backbone can be coupled to a conducting or semiconducting segment thereby providing the conducting or semiconducting segment with improved properties. For example, the chemical and physical properties of the polymer segment can impart improved solubility, malleability, etc. on the conducting or semiconducting segment to which it is coupled.

Polymers according to the invention do not contain a RAFT functional group in between the conducting or semiconducting segment and polymer segment having an insulating polymer backbone. By "in between" is meant those contiguous, covalently bonded atoms, or covalent bond, of the polymer which couple the conducting or semiconducting segment to the polymer segment having an insulating polymer backbone. By the RAFT functional group not being "in between", the conducting or semiconducting segment and polymer segment will remain coupled in the event that the RAFT functional group is inadvertently or deliberately decoupled from the polymer. For example it may be desirable to remove the RAFT functional group from the polymer. Polymers according to the present invention enable this to occur without disrupting the coupling between the conducting or semiconducting segment and the polymer segment. The utility provided by the polymer segment having the insulating polymer backbone is therefore retained in the absence of the RAFT functional group.

As will be discussed in more detail below, according to the process of the invention, the polymer segment having an insulating polymer backbone in the polymers is typically derived from the polymerisation of one or more ethylenically unsaturated monomers under the control of the RAFT functional group of the macro-RAFT agent and accordingly the polymer backbone typically has a polyethylene-type structure.

RAFT derived polymers coupled to polythiophene segments are described in WO2007/025189. The RAFT functional group in the polymers described therein is, however, located between the polythiophene segment and the polymer segment. Accordingly, where the RAFT functional group is to be removed, the polythiophene portion of the polymer will be cleaved from the RAFT polymerised portion of the polymer. In this case the advantages provided by the polymer segment are lost.

Further aspects of the invention will be described below.

DETAILED DESCRIPTION OF THE INVENTION

Figure 1:
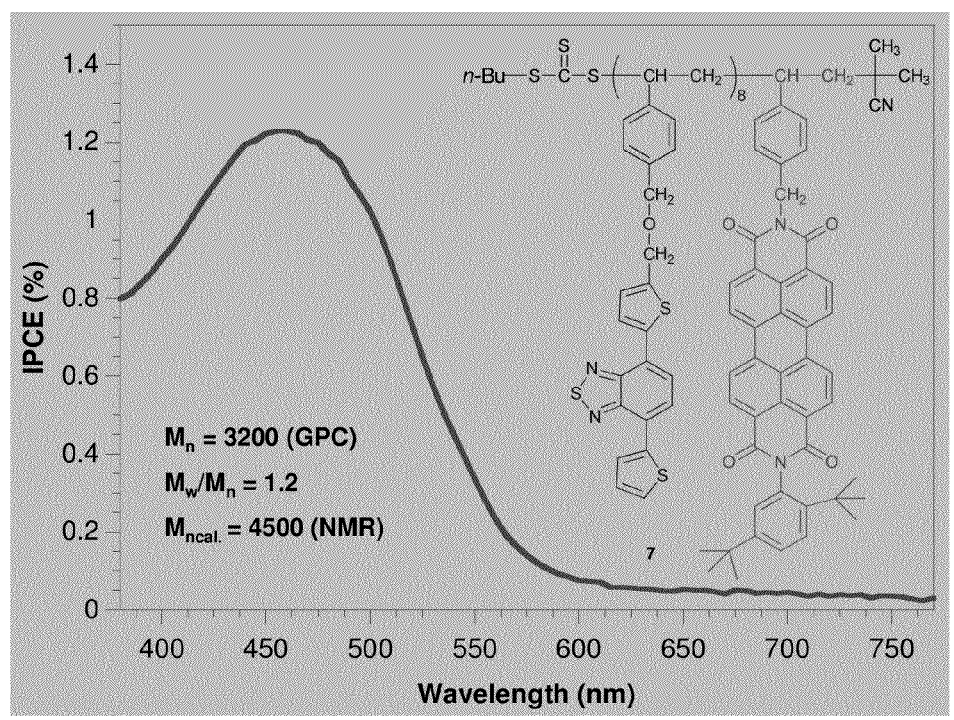
FIG. 1 shows the IPCE spectrum for MM1.

As used herein the expression "conducting segment" refers to a chemical moiety which is, of itself, conducting.

As used herein the terms "insulator" and "insulating" refer to a material and a property of a material, respectively, that does not conduct at all.

With respect to the degree of conduction, between the categories of "conductor" and "insulator" is a separate class of materials referred to as "semiconductors" that, depending on the application of external stimuli, may adopt the properties of either a conductor or insulator. Accordingly, as used herein, the expression "semiconducting segment" refers to a chemical moiety that under certain conditions exhibits the properties of an insulator but may become conducting when subjected to certain external stimuli. Examples of such external stimuli are the application of an electric field and simple chemical modification. For example, at room temperature the material may prevent the flow of electric current (thereby functioning as an insulator) but when subjected to a sufficiently strong electric field may conduct electric current (thereby functioning as a conductor). Alternatively the material may be subjected to chemical modification through chemical reaction with, for example, an inorganic and/or organic reagent. In other examples the modification may be through electrochemical means. In some examples of chemical modification, the process of enhancing or creating conducting properties within a chemical moiety is referred to as "doping". Doping may occur, for example, by removal (p-doping) or addition (n-doping) of one or more electrons from the chemical moiety. As an example, poly(thiophene) may be doped by reaction with halogens (eg iodine or bromine), organic acids (eg trifluoroacetic acid or propionic acid) or metal salts (eg ferric chloride).

A specific example of a semiconducting material which is otherwise insulating, but may be doped to become conducting is poly(aniline). Poly(aniline) may be represented by the following formula (where p is the degree of polymerisation):

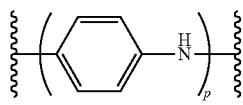

Poly(aniline) (shown in the formula below wherein x relates to the degree of polymerisation) may be oxidised from its reduced state known as leucoemeraldine (n=1, m=0) into the increasingly more oxidised forms of protoemeraldine, emeraldine (n=m=0.5), nigraniline and pernigraniline (n=0, m=1) thereby enhancing the conducting properties of the material:

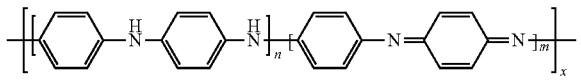

Accordingly poly(aniline), in the reduced state of leucoemeraldine is insulating, yet represents an example of a semiconducting segment in accordance with the invention, since it may be induced to conduct electricity through chemical modification.

The degree of conjugation within a segment may affect the conducting or semiconducting properties of the material. Through the use of such techniques as UV spectroscopy, and/or an estimation of the band gap between the Highest Occupied Molecular Orbital (HOMO) and Lowest Unoccupied Molecular Orbital (LUMO), the polymer chemist is able to predict and/or determine whether a given polymer is conducting, semiconducting or insulating. It is believed that band gap between the HOMO and LUMO levels in conducting and semi-conducting materials is smaller than the band gap in insulating materials. Without wishing to be bound by theory it is believed that the presence of heteroatoms in the segment may enhance the conducting properties of that segment.

The conducting/semiconducting segment has been broadly defined with reference to the conducting/semiconducting properties of the segment. On a structural level, the conducting segment of the present invention preferably comprises a conducting polymer Likewise the semiconducting segment of the present invention preferably comprises a semiconducting polymer. Of course, the polymer chemist will be familiar with the concept of a polymer. When the conducting/semiconducting segment comprises a conducting/semiconducting polymer, the polymer will be identifiable as comprising a number of structural repeat units. As used herein the expression "structural repeat unit" refers to a chemical moiety (the "unit") within the conducting/semiconducting segment which is bonded to at least one other of the same type of chemical moiety within the conducting/semiconducting segment. Depending on the nature of the structural repeat unit, the polymer may be a homopolymer or copolymer (including alternating copolymer). Moreover, the polymer may be a block copolymer wherein, for example, the polymer comprises a block with a certain type of structural repeat unit and a second block with second type of structural repeat unit. In each case, each unit may be independently optionally substituted. Examples of repeat units which fall within the scope of the present invention include: thiophene, acetylene, aniline, pyrrole, phenylene, phenylene vinylene, fluorene and acene. Whilst the examples given correspond to chemical moieties of varying valency, it is understood that the polymer chemist will be familiar with the notation used and will be aware that the polymeric forms of the exemplified repeat units are respectively: poly(thiophene), poly(acetylene), poly(aniline), poly(pyrrole), poly(phenylene), poly(phenylene vinylene), poly(fluorene) and poly(acene). Examples of structures which correspond to these polymeric forms are given below (where n corresponds to the number of structural repeat units):

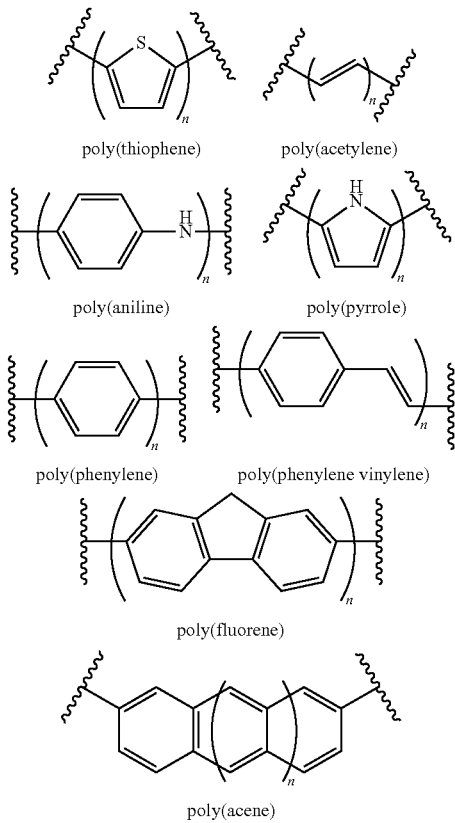

In some examples the "structural repeat unit" may be the conjugate of two different smaller units. An example of a semiconducting segment formed from such a unit is the benzothiadiazole-fluorene conjugate shown below (where n corresponds to the number of structural repeat units):

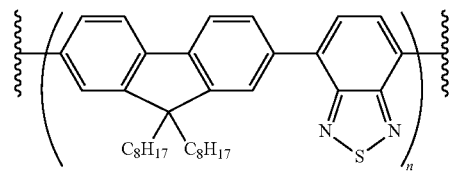

It will be understood that the above structures are representative only, and that the polymer chemist is familiar with techniques which allow modification of, for example, double bond geometry (where applicable), the pattern of substitution and/or the degree of substitution. For example, poly(acetylene) and poly(phenylene vinylene) may be synthesised or subsequently modified so that one or more double bonds within the polymer are of cis-geometry. Also, each hydrogen atom in the thiophene structural repeat unit shown above, for example, may be independently optionally substituted. Whilst the structure below shows 4 differently substituted thiophene moieties, as used herein the chemical structure provides an example of a chemical moiety of "at least 4 structural repeat units" wherein the repeat unit is thiophene:

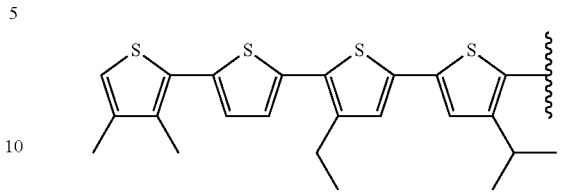

The present invention contemplates that modification of the substitution pattern of the polymer may modify the properties of the material. For example, substitution of one or more hydrogen atoms in poly(thiophene) with lipophilic groups may increase the lipophilicity of the polymer. Substitution with certain groups may affect the conducting/semiconducting properties of a conducting/semiconducting material through, for example, inductive or mesomeric effects on the electron density in the structural repeat units.

It is believed that the utility of a conducting/semiconducting material is often related to the type and number of structural repeat units present therein. It is believed that whilst trifluorene is neither a conductor nor a semiconductor, tetrathiophene is a semiconductor. There may be a relationship between the type of structural repeat unit in the segment and the number of structural repeat units in the conducting/semiconducting segment, which may assist in predicting and/or determining whether the segment is conducting/semiconducting or not. In this respect the conducting/semiconducting segment may preferably contain 4 or more structural repeat units, more preferably the conducting/semiconducting segment may contain 7 or more structural repeat units, more preferably the conducting/semiconducting segment may contain 10 or more structural repeat units. For example, heptafluorene may be a conductor or semiconductor whereas trifluorene is not a conductor or semiconductor.

As used herein the expression "polymer segment having an insulating polymer backbone" refers to a polymer segment having a backbone wherein the backbone does not conduct, nor is capable of conducting. The polymer backbone in such polymer segments will generally neither have conjugation nor be capable of being readily modified to attain conjugation. The polymer segment will generally be formed via RAFT polymerisation, but may be obtained by other polymerisation means (such as free radical polymerisation, controlled radical polymerisation and anionic/cationic polymerisation). It is understood that the conducting or semiconducting segment will be selected so as not to significantly hinder the formation of the polymer segment.

It will be understood that the skilled worker will be able to routinely identify the backbone of a given polymer. For example, the backbone of poly(styrene) has a polyethylene-type structure. The polymer backbone may also be described as forming at least part of the coupling between the conducting/semiconducting segment and the RAFT functional group such that were the polymer backbone to be severed, the conducting/semiconducting segment and the RAFT functional group would become decoupled.

An example of a polymer segment having an insulating polymer backbone is shown below (wherein x and y are positive integers):

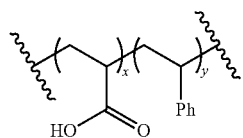

The above example also demonstrates that the polymer segment may be a co-polymer, which may be a block co-polymer. The polymer segment may be a homo-polymer.

The polymer segments (having insulating polymer backbones) of the present invention may comprise one or more moieties which of themselves are conducting or semiconducting, so long as the backbone remains insulating. An example of such a moiety is a group that is pendant from the backbone of the polymeric segment. The pendant group may be derived from the polymerisation of a monomer. An example (shown below) of such a monomer is N-(4-vinylbenzyl)-N'-(2,5-di-tert-butylphenyl)-perylenedimide (PSPDI) which is a styrene-type monomer:

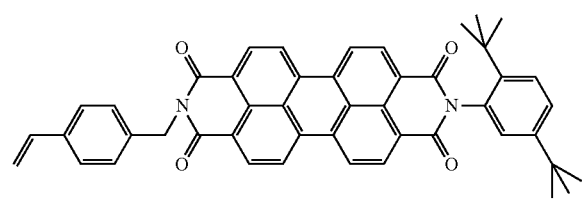 [SMILES: C=Cc1ccc(CN2C(=O)c3ccc4c5ccc6c7c(ccc(c8ccc(c3c48)C2=O)c75)C(=O)N(c2cc(C(C)(C)C)ccc2C(C)(C)C)C6=O)cc1]

Other examples of monomers which may be polymerised to form the polymer segment (having an insulating polymer backbone) include (meth)acrylate and (meth)acrylamide monomers which are substituted with one or more groups of the following formula:

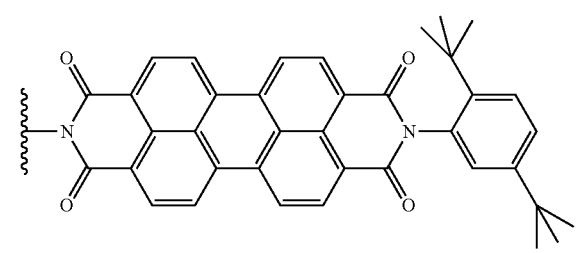 [SMILES: *N1C(=O)c2ccc3c4ccc5c6c(ccc(c7ccc(c2c37)C1=O)c64)C(=O)N(c1cc(C(C)(C)C)ccc1C(C)(C)C)C5=O]

Other examples of monomers which may be polymerised to form the polymer segment (having an insulating backbone) include (meth)acrylate, (meth)acrylamide and styrene monomers which are substituted with one or more groups of the following formula:

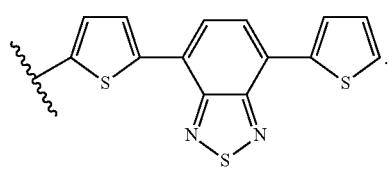 [SMILES: *c1ccc(-c2ccc(-c3cccs3)c3nsnc23)s1]

Other examples of monomers which may be polymerised to form the polymer segment (having an insulating backbone) include (meth)acrylate, (meth)acrylamide and styrene monomers which are substituted with one or more groups of the following formula:

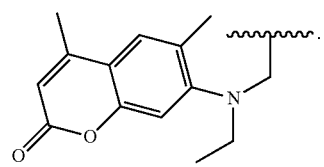 [SMILES: *CN(CC)c1cc2oc(=O)cc(C)c2cc1C]

An example of such a monomer is provided by the following formula:

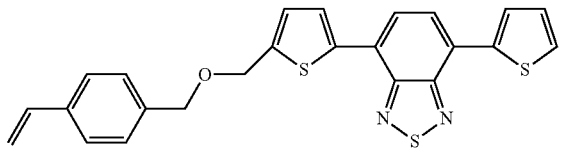 [SMILES: C=Cc1ccc(COCc2ccc(-c3ccc(-c4cccs4)c4nsnc34)s2)cc1]

Monomers providing such pendant conducting or semiconducting segments are believed to be novel in their own right. Accordingly, in a further aspect the present invention provides ethylenically unsaturated monomers comprising a conducting or semiconducting segment. In some embodiments the monomers are (meth)acrylate, (meth)acrylamide and styrene monomers which are substituted with: triarylmethyl; triarylamino; oxadiazole; carbazole or groups of the formulae:

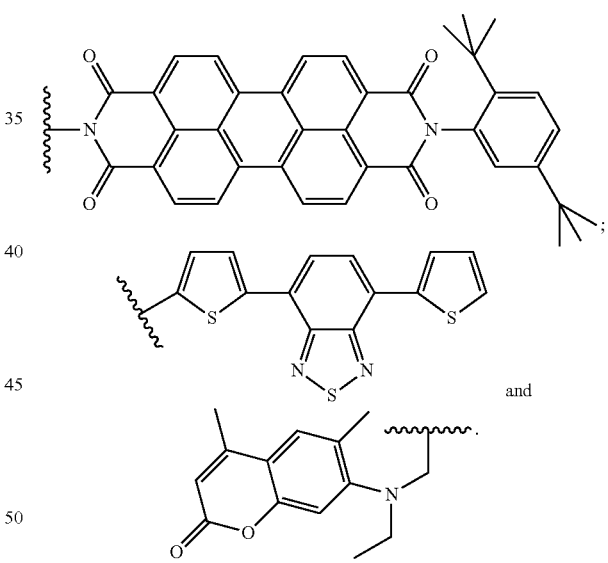

and

In some embodiments the monomers have the structural formula:

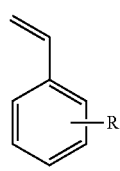

wherein R represents a groups comprising a conducting or semiconducting segment. Examples of preferred monomers are represented by the formulae:

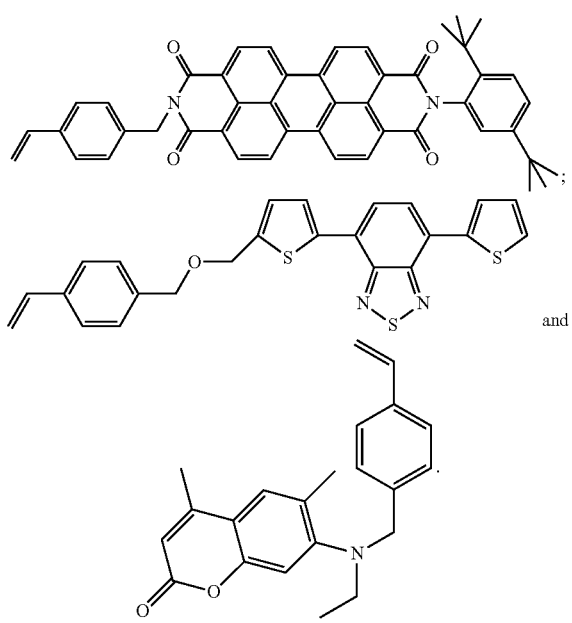

In the polymers of the present invention, the conducting/semiconducting segment is coupled to the polymer segment (having an insulating polymer backbone) by a covalent bond or a linking group.

The RAFT functional group is coupled to the polymer segment (having an insulating polymer backbone) by a covalent bond or a linking group. Preferably the polymer segment is coupled to the RAFT functional group by a covalent bond.

As used herein the expression "RAFT functional group" refers to a functional group comprising a thiocarbonylthio group (which is a divalent moiety represented by: —C(S)S—). Examples of RAFT functional groups are described in Moad, G.; Rizzardo, R; Thang, S. H. *Polymer* 2008, 49, 1079-1131 (the contents of which are incorporated herein by reference) and include dithioesters, dithiocarbonates, dithiocarbamates and trithiocarbonates. Accordingly the RAFT functional group is a divalent (dithioesters, dithiocarbonates, trithiocarbonates) or trivalent (dithiocarbamates) moiety. Whilst it is understood that the dithioester, dithiocarbonate, dithiocarbamate and trithiocarbonate functional groups, of themselves, may have been known prior to the discovery of RAFT polymerisation, it is useful in the context of the present invention to refer to them as RAFT functional groups. A feature of RAFT polymerisation is that a given RAFT functional groups is capable of reacting with a radical species, in particular a carbon-centred radical species. Without wishing to be bound by theory, in the course of RAFT polymerisation, each of the sulfur atoms of the thiocarbonylthio group of the RAFT functional group alternate between being covalently bonded to the carbon atom of the thiocarbonyl group by a single or double bond. Furthermore, the thiocarbonylthio group may be transformed during RAFT polymerisation into a carbon-centred radical species. It is understood that the polymer chemist will recognise that while the nature of bonding within the RAFT functional group may change during the course of RAFT polymerisation, the RAFT functional group will be able to be readily recognised by the location of the carbon and two sulfur atoms of the thiocarbonylthio group.

The invention is predicated in part on the discovery that the RAFT functional group is a cleavable group which, if undesirably positioned in between the conducting/semiconducting segment and the polymer segment having an insulating polymer backbone, may result in separation of the conducting/semiconducting segment and the polymer segment when the polymer is contacted with a cleaving agent. The C—S bond of the thiocarbonylthio containing RAFT functional group is capable of undergoing heterolytic cleavage in, for example, the presence of a nucleophilic species such as water or an amine (including ammonia). Accordingly, reaction of a nucleophilic species with a polymer comprising a conducting/semiconducting segment coupled to a polymer segment (having an insulating polymer backbone) by a RAFT functional group may lead to decoupling of the conducting/semiconducting segment from the polymer segment. This decoupling may negate the desired effect of producing a conducting/semiconducting polymer with improved properties.

Accordingly, in the polymers of the present invention there is no RAFT functional group in between the conducting/semiconducting segment and the polymer segment having an insulating polymer backbone. Of course, when the coupling between the conducting/semiconducting segment and the polymer segment having an insulating polymer backbone consists of a covalent bond there is no possibility for any group, such as a RAFT functional group, to be present in the coupling. In other cases, where the coupling between the conducting/semiconducting segment and the polymer segment having an insulating polymer backbone consists of a linking group, the term "in between" refers specifically to the part of the linking group which consists of contiguous, covalently bonded atoms which couple the conducting/semiconducting segment to the polymer segment having an insulating polymer backbone. The contiguous atoms may be optionally substituted such as to have, for example, branching. In one or more of those branches, there may be one or more other RAFT functional groups, but at all times it must be possible to identify contiguous atoms which covalently bond the conducting/semiconducting segment to the polymer segment having an insulating polymer backbone, wherein the contiguous atoms do not contain a C—S bond of a RAFT functional group. An example of a polymer containing a branched linking group which couples a semiconducting segment to a polymer segment having an insulating polymer backbone such that there is no RAFT functional group in between the two segments is shown below:

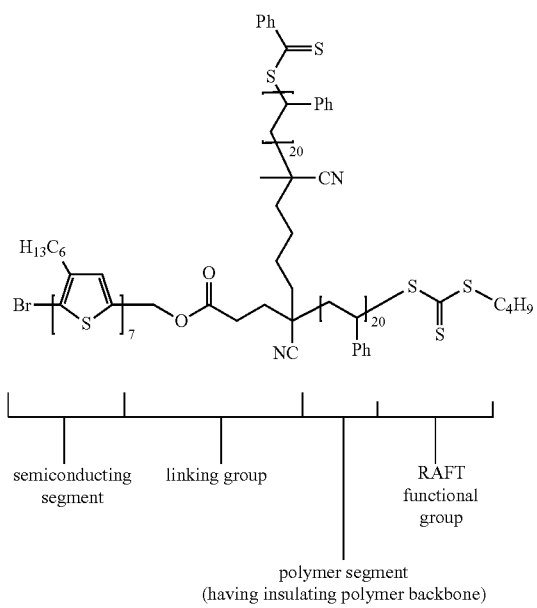

Where present, the or each linking group is a multivalent moiety, preferably a divalent organic substituent. Preferably the or each linking group is a divalent form of a group selected from alkyl, alkenyl, alkynyl, aryl, acyl, carbocyclyl, heterocyclyl, heteroaryl, alkyloxy, alkenyloxy, alkynyloxy, aryloxy, acyloxy, carbocyclyloxy, heterocyclyloxy, heteroaryloxy, alkylthio, alkenylthio, alkynylthio, arylthio, acylthio, carbocyclylthio, heterocyclylthio, heteroarylthio, alkylalkenyl, alkylalkynyl, alkylaryl, alkylacyl, alkylcarbocyclyl, alkylheterocyclyl, alkylheteroaryl, alkyloxyalkyl, alkenyloxyalkyl, alkynyloxyalkyl, aryloxyalkyl, alkylacyloxy, alkyloxyacylalkyl, alkylcarbocyclyloxy, alkylheterocyclyloxy, alkylheteroaryloxy, alkylthioalkyl, alkenylthioalkyl, alkynylthioalkyl, arylthioalkyl, alkylacylthio, alkylcarbocyclylthio, alkylheterocyclylthio, alkylheteroarylthio, alkylalkenylalkyl, alkylalkynylalkyl, alkylarylalkyl, alkylacylalkyl, arylalkylaryl, arylalkenylaryl, arylalkynylaryl, arylacylaryl, arylacyl, arylcarbocyclyl, arylheterocyclyl, arylheteroaryl, alkenyloxyaryl, alkynyloxyaryl, aryloxyaryl, arylacyloxy, arylcarbocyclyloxy, arylheterocyclyloxy, arylheteroaryloxy, alkylthioaryl, alkenylthioaryl, alkynylthioaryl, arylthioaryl, arylacylthio, arylcarbocyclylthio, arylheterocyclylthio, and arylheteroarylthio.

More preferably, the or each linking group is a divalent form of any of the groups selected from $C_1$-$C_{18}$ alkyl, $C_2$-$C_{18}$ alkenyl, $C_2$-$C_{18}$ alkynyl, $C_6$-$C_{18}$ aryl, $C_1$-$C_{18}$ acyl, $C_3$-$C_{18}$ carbocyclyl, $C_2$-$C_{18}$ heterocyclyl, $C_3$-$C_{18}$ heteroaryl, $C_1$-$C_{18}$ alkyloxy, $C_2$-$C_{18}$ alkenyloxy, $C_2$-$C_{18}$ alkynyloxy, $C_6$-$C_{18}$ aryloxy, $C_1$-$C_{18}$ acyloxy, $C_3$-$C_{18}$ carbocyclyloxy, $C_2$-$C_{18}$ heterocyclyloxy, $C_3$-$C_{18}$ heteroaryloxy, $C_1$-$C_{18}$ alkylthio, $C_2$-$C_{18}$ alkenylthio, $C_2$-$C_{18}$ alkynylthio, $C_6$-$C_{18}$ arylthio, $C_1$-$C_{18}$ acylthio, $C_3$-$C_{18}$ carbocyclylthio, $C_2$-$C_{18}$ heterocyclylthio, $C_3$-$C_{18}$ heteroarylthio, $C_3$-$C_{18}$ alkylalkenyl, $C_3$-$C_{18}$ alkylalkynyl, $C_7$-$C_{24}$ alkylaryl, $C_2$-$C_{18}$ alkylacyl, $C_4$-$C_{18}$ alkylcarbocyclyl, $C_3$-$C_{18}$ alkylheterocyclyl, $C_4$-$C_{18}$ alkylheteroaryl, $C_2$-$C_{18}$ alkyloxyalkyl, $C_3$-$C_{18}$ alkenyloxyalkyl, $C_3$-$C_{18}$ alkynyloxyalkyl, $C_7$-$C_{24}$ aryloxyalkyl, $C_2$-$C_{18}$ alkylacyloxy, $C_{2-18}$ alkyloxyacyl $C_{2-18}$ alkyl, $C_4$-$C_{18}$ alkylcarbocyclyloxy, $C_3$-$C_{18}$ alkylheterocyclyloxy, $C_4$-$C_{18}$ alkylheteroaryloxy, $C_2$-$C_{18}$ alkylthioalkyl, $C_3$-$C_{18}$ alkenylthioalkyl, $C_3$-$C_{18}$ alkynylthioalkyl, $C_7$-$C_{24}$ arylthioalkyl, $C_2$-$C_{18}$ alkylacylthio, $C_4$-$C_{18}$ alkylcarbocyclylthio, $C_3$-$C_{18}$ alkylheterocyclylthio, $C_4$-$C_{18}$ alkylheteroarylthio, $C_4$-$C_{18}$ alkylalkenylalkyl, $C_4$-$C_{18}$ alkylalkynylalkyl, $C_8$-$C_{24}$ alkylarylalkyl, $C_3$-$C_{18}$ alkylacylalkyl, $C_{13}$-$C_{24}$ arylalkylaryl, $C_{14}$-$C_{24}$ arylalkenylaryl, $C_{14}$-$C_{24}$ arylalkynylaryl, $C_{13}$-$C_{24}$ arylacylaryl, $C_7$-$C_{18}$ arylacyl, $C_9$-$C_{18}$ arylcarbocyclyl, $C_8$-$C_{18}$ arylheterocyclyl, $C_9$-$C_{18}$ arylheteroaryl, $C_8$-$C_{18}$ alkenyloxyaryl, $C_8$-$C_{18}$ alkynyloxyaryl, $C_{12}$-$C_{24}$ aryloxyaryl, $C_7$-$C_{18}$ arylacyloxy, $C_9$-$C_{18}$ arylcarbocyclyloxy, $C_8$-$C_{18}$ arylheterocyclyloxy, $C_9$-$C_{18}$ arylheteroaryloxy, $C_7$-$C_{18}$ alkylthioaryl, $C_8$-$C_{18}$ alkenylthioaryl, $C_8$-$C_{18}$ alkynylthioaryl, $C_{12}$-$C_{24}$ arylthioaryl, $C_7$-$C_{18}$ arylacylthio, $C_9$-$C_{18}$ arylcarbocyclylthio, $C_8$-$C_{18}$ arylheterocyclylthio, and $C_9$-$C_{18}$ arylheteroarylthio.

Still more preferably, the or each linking group is a divalent form of a group selected from alkyl (e.g. $C_1$-$C_{18}$, $C_1$-$C_6$, $C_1$-$C_5$, $C_8$-$C_{18}$, or $C_9$-$C_{18}$), aryl (e.g. $C_6$-$C_{18}$), heteroaryl (e.g. $C_3$-$C_{18}$), carbocyclyl (e.g. $C_3$-$C_{18}$), heterocyclyl (e.g. $C_2$-$C_{18}$), alkylaryl (e.g. $C_7$-$C_{24}$), alkylheteroaryl (e.g. $C_4$-$C_{18}$), alkylcarbocyclyl (e.g. $C_4$-$C_{18}$), alkyloxyacylalkyl (e.g. wherein each alkyl is $C_{2-18}$) and alkylheterocyclyl (e.g. $C_3$-$C_{18}$).

In the lists above defining divalent groups from which the or each linking group may be selected, each alkyl, alkenyl, alkynyl, aryl, carbocyclyl, heteroaryl, and heterocyclyl moiety may be optionally substituted. For avoidance of any doubt, where a given linking group contains two or more of such moieties (e.g. alkylaryl), each of such moieties may be optionally substituted with one, two, three or more optional substituents as herein defined.

In the lists above defining divalent groups from which the or each linking group may be selected, where a given linking group contains two or more subgroups (e.g. [group A][group B]), the order of the subgroups is not intended to be limited to the order in which they are presented. Thus, a linking group with two subgroups defined as [group A][group B] (e.g. alkylaryl) is intended to also be a reference to a linking group with two subgroups defined as [group B][group A] (e.g. arylalkyl).

The or each linking group may be branched and/or optionally substituted. Where the or each linking group comprises an optionally substituted alkyl moiety, a preferred optional substituent includes where a —$CH_2$— group in the alkyl chain is replaced by a group selected from —O—, —S—, —$NR^a$—, —C(O)— (i.e. carbonyl), —C(O)O— (i.e. ester), and —C(O)$NR^a$— (i.e. amide), where $R^a$ may be selected from hydrogen, alkyl, alkenyl, alkynyl, aryl, carbocyclyl, heteroaryl, heterocyclyl, arylalkyl, and acyl.

Where present, the or each linking group preferably comprises one or more chemical groups which are capable of stabilising a radical species cc to them. Examples of these radical stabilising groups are cyano, carboxyl, alkoxycarbonyl, alkyl and phenyl.

The polymers of the present invention, wherein the polymer segment having an insulating polymer backbone separates the conducting/semiconducting segment from the RAFT functional group, may have a range of molecular architectures. Representative examples of such structures are shown below schematically ("A" corresponds to the RAFT functional group; "B" corresponds to the polymer segment having an insulating polymer backbone; "C" corresponds to the conducting/semiconducting segment):

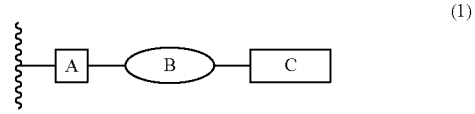

(1)

for example:

(1a)

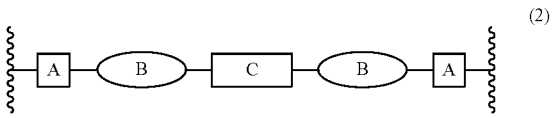

(2)

Other examples of molecular architectures which are relatively complex include star-polymers such as those represented by the following structures:

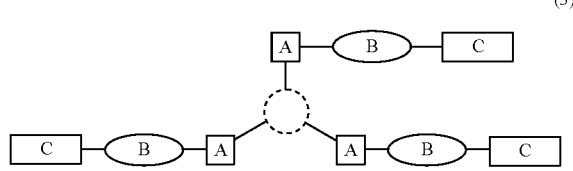

(3)

-continued

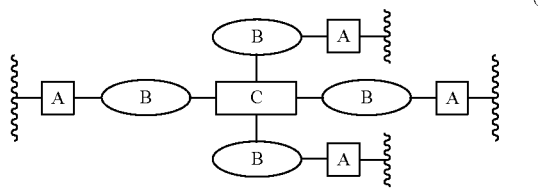
(4)

In a preferred embodiment, the conducting/semiconducting segment represents a terminal segment of the polymer. Examples of polymers wherein the conducting/semiconducting segment is a terminal segment are shown below:

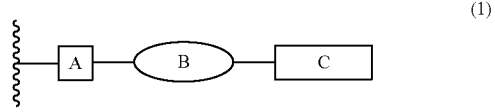
(1)

for example:

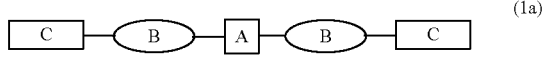
(1a)

An example of a molecular architecture which is relatively complex, and wherein the conducting/semiconducting segment is a terminal segment, is the star-polymer shown below:

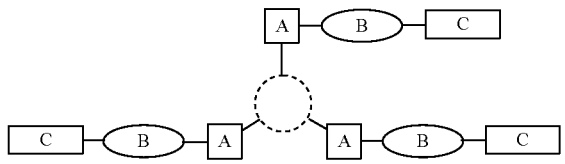
(3)

As can be seen in the schematically represented structures 1, 1a and 3, the conducting/semiconducting segment represented by "C" is a terminal segment of the polymer. Whilst the term is intended to embrace groups in those positions which are substituted with eg alkyl etc, architectures such as:

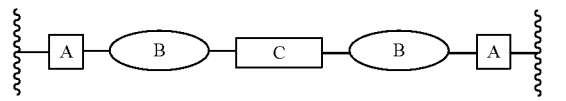
(2)

wherein the conducting/semiconducting segment of the polymer is essentially "sandwiched" between, for example two RAFT functional groups of the polymer, are not as preferable as those architectures comprising a terminal conducting/semiconducting segment.

It is believed that polymers in which the conducting/semiconducting segment is a terminal segment may provide greater exposure of the conducting/semiconducting segment to such external stimuli as light, electric field, magnetic field, etc. Furthermore it is believed that polymers in which the conducting/semiconducting segment is a terminal segment may provide for such polymers to be coupled to substrates such as films or particles whilst maintaining separation of the conducting/semiconducting segment from the substrate. Alternatively, in some applications, it may be desirable to locate the conducting/semiconducting segment in close proximity to a substrate to effect efficient charge transfer, for example. The polymers of the present invention are believed to be well-suited to these applications. Examples of functional groups that facilitate binding to surfaces are phosphonic acids (—PO(OH)$_2$), phosphinic acids (—P(O)H(OH)), sulphonic acids (—SO$_2$ONa), trialkoxysilanes (—Si(OCH$_3$)$_3$) and carboxylic acids (—CO$_2$H).

In preferred embodiments, the polymers of the present invention may be represented by the following formula (I):

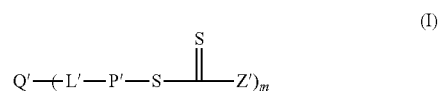
(I)

wherein:

m is a positive integer;

Q' is an m-valent conducting or semiconducting segment;

L' is a covalent bond or a linking group;

P' is a polymer segment having an insulating polymer backbone; and

Z' is a group that allows the polymer to function as a macro-RAFT agent in the polymerisation of one or more ethylenically unsaturated monomers.

Whilst it is understood that the Z' group allows the polymer to function as a macro-RAFT agent in the polymerisation of one or more ethylenically unsaturated monomers, the polymer chemist will understand that the Z' group is typically a remnant of the macro-RAFT agent originally used to prepare the polymer. Furthermore, Z' may be any group that can promote sufficient reactivity of the thiocarbonyl group to radical addition while not slowing the rate of fragmentation to the extent that there is an unacceptable retardation of polymerisation. Accordingly, whilst the Z' group allows the polymer to function as a macro-RAFT agent, the polymer itself may, if desired, take no further part in a polymerisation process. Accordingly, it will be convenient to further define the Z' group with reference to its role in a RAFT polymerisation process.

Z' may be halo or a group bonded to the thiocarbonyl group of formula (I) through carbon, oxygen, nitrogen or sulfur. According to the present invention, the Z' group is typically selected having regard to the monomers that are to be polymerised. When the Z' group is bonded to the thiocarbonyl group of formula (I) through nitrogen (affording a dithiocarbamate) or through oxygen (affording a xanthate), polymerisation of monomers with unstable propagating radicals (i.e. less activated monomers such as vinyl acetate, N-vinylpyrrolidone and N-vinylcarbazole) can be achieved. When the Z' group is bonded to the thiocarbonyl group of formula (I) through carbon (affording a dithioester) or through sulfur (affording a trithiocarbonate group), polymerisation of monomers with stable propagating radicals (i.e. more activated monomers such as methacrylate esters and styrene) can be achieved.

WO 2006/122344 discloses macro-RAFT agents in which the RAFT functional group is bonded to fluorine. RAFT agents of this type are said to have the potential to polymerise monomers having disparate reactivities.

Preferably, Z' is the monovalent form of a group selected from fluorine, chlorine, bromine, iodine, alkyl, aryl, acyl, amino, carbocyclyl, heterocyclyl, heteroaryl, alkyloxy, aryloxy, acyloxy, acylamino, carbocyclyloxy, heterocyclyloxy, heteroaryloxy, alkylthio, arylthio, acylthio, carbocyclylthio, heterocyclylthio, heteroarylthio, alkylaryl, alkylacyl, alkylcarbocyclyl, alkylheterocyclyl, alkylheteroaryl, alkyloxyalkyl, aryloxyalkyl, alkylacyloxy, alkylcarbocyclyloxy, alkylheterocyclyloxy, alkylheteroaryloxy, alkylthioalkyl, arylthioalkyl, alkylacylthio, alkylcarbocyclylthio, alkylheterocyclylthio, alkylheteroarylthio, alkylarylalkyl, alkylacylalkyl, arylalkylaryl, arylacylaryl, arylacyl, arylcarbocyclyl, arylheterocyclyl, arylheteroaryl, aryloxyaryl, arylacyloxy, arylcarbocyclyloxy, arylheterocyclyloxy, arylheteroaryloxy, alkylthioaryl, arylthioaryl, arylacylthio, arylcarbocyclylthio, arylheterocyclylthio, arylheteroarylthio, dialkyloxy-, diheterocyclyloxy- or diaryloxy-phosphinyl, dialkyl-, diheterocyclyl- or diaryl-phosphinyl, cyano (i.e. —CN), and a polymer chain formed by any mechanism. More preferably, Z' is the monovalent form of a group selected from fluorine, chlorine, $C_1$-$C_{18}$ alkyl, $C_6$-$C_{18}$ aryl, $C_1$-$C_{18}$ acyl, amino, $C_3$-$C_{18}$ carbocyclyl, $C_2$-$C_{18}$ heterocyclyl, $C_3$-$C_{18}$ heteroaryl, $C_1$-$C_{18}$ alkyloxy, $C_6$-$C_{18}$ aryloxy, $C_1$-$C_{18}$ acyloxy, $C_3$-$C_{18}$ carbocyclyloxy, $C_2$-$C_{18}$ heterocyclyloxy, $C_3$-$C_{18}$ heteroaryloxy, $C_1$-$C_{18}$ alkylthio, $C_6$-$C_{18}$ arylthio, $C_1$-$C_{18}$ acylthio, $C_3$-$C_{18}$ carbocyclylthio, $C_2$-$C_{18}$ heterocyclylthio, $C_3$-$C_{18}$ heteroarylthio, $C_7$-$C_{24}$ alkylaryl, $C_2$-$C_{18}$ alkylacyl, $C_4$-$C_{18}$ alkylcarbocyclyl, $C_3$-$C_{18}$ alkylheterocyclyl, $C_4$-$C_{18}$ alkylheteroaryl, $C_2$-$C_{18}$ alkyloxyalkyl, $C_7$-$C_{24}$ aryloxyalkyl, $C_2$-$C_{18}$ alkylacyloxy, $C_4$-$C_{18}$ alkylcarbocyclyloxy, $C_3$-$C_{18}$ alkylheterocyclyloxy, $C_4$-$C_{18}$ alkylheteroaryloxy, $C_2$-$C_{18}$ alkylthioalkyl, $C_7$-$C_{24}$ arylthioalkyl, $C_2$-$C_{18}$ alkylacylthio, $C_4$-$C_{18}$ alkylcarbocyclylthio, $C_3$-$C_{18}$ alkylheterocyclylthio, $C_4$-$C_{18}$ alkylheteroarylthio, $C_8$-$C_{24}$ alkylarylalkyl, $C_3$-$C_{18}$ alkylacylalkyl, $C_{13}$-$C_{24}$ arylalkylaryl, $C_{13}$-$C_{24}$ arylacylaryl, $C_7$-$C_{18}$ arylacyl, $C_9$-$C_{18}$ arylcarbocyclyl, $C_8$-$C_{18}$ arylheterocyclyl, $C_9$-$C_{18}$ arylheteroaryl, $C_{12}$-$C_{24}$ aryloxyaryl, $C_7$-$C_{18}$ arylacyloxy, $C_9$-$C_{18}$ arylcarbocyclyloxy, $C_8$-$C_{18}$ arylheterocyclyloxy, $C_9$-$C_{18}$ arylheteroaryloxy, $C_7$-$C_{18}$ alkylthioaryl, $C_{12}$-$C_{24}$ arylthioaryl, $C_7$-$C_{18}$ arylacylthio, $C_9$-$C_{18}$ arylcarbocyclylthio, $C_8$-$C_{18}$ arylheterocyclylthio, $C_9$-$C_{18}$ arylheteroarylthio, dialkyloxy-, diheterocyclyloxy- or diaryloxy-phosphinyl (i.e. —P(=O)OR$^k_2$), dialkyl-, diheterocyclyl- or diaryl-phosphinyl (i.e. —P(=O)R$^k_2$), where R$^k$ is selected from optionally substituted $C_1$-$C_{18}$ alkyl, optionally substituted $C_6$-$C_{18}$ aryl, optionally substituted $C_2$-$C_{18}$ heterocyclyl, and optionally substituted $C_7$-$C_{24}$ alkylaryl, cyano (i.e. —CN), and a polymer chain formed by any mechanism having a number average degree of polymerisation in the range of 5 to 1000.

In the lists above defining groups from which Z' may be selected, each alkyl, aryl, carbocyclyl, heteroaryl, and heterocyclyl moiety may be optionally substituted. For avoidance of any doubt where a given Z' group contains two or more of such moieties (e.g. alkylaryl), each of such moieties may be optionally substituted with one, two, three or more optional substituents as herein defined.

Where Z' comprises an optionally substituted alkyl moiety, a preferred optional substituent includes where a —CH$_2$— group in the alkyl chain is replaced by a group selected from —O—, —S—, —NR$^a$—, —C(O)— (i.e. carbonyl), —C(O)O— (i.e. ester), and —C(O)NR$^a$— (i.e. amide), where R$^a$ may be selected from hydrogen, alkyl, alkenyl, alkynyl, aryl, carbocyclyl, heteroaryl, heterocyclyl, arylalkyl, and acyl.

In some embodiments, the Z' group may comprise a surface (including the surface of a film or particle), or may comprise a group capable of being bonded to a surface (including the surface of a film or particle). Examples of groups which are capable of being bonded to a surface include phosphonic acids [—PO(OH)$_2$], phosphinic acids [—P(O)H(OH)], sulphonic acids [—SO$_2$OH], trialkoxysilanes [—Si(OCH$_3$)$_3$] and carboxylic acids [—CO$_2$H]

In some embodiments, the Z' group comprises a conducting segment or a semiconducting segment. In some embodiments, the Z' group comprises a conducting segment or a semiconducting segment which is coupled to the thiocarbonyl group of formula (I) through sulfur. In some embodiments, the Z' group comprises a conducting segment or a semiconducting segment and a polymer segment having an insulating polymer backbone. The trithiocarbonate functional group is a symmetrical RAFT functional group which may facilitate the production of symmetrical polymer materials which may be represented by formula (II):

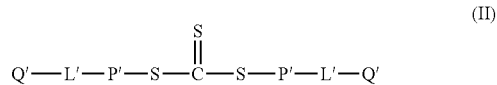
(II)

wherein Q', L' and P' are as defined above.

As used herein the expression "m-valent" refers the valency of a moiety with respect to the positive integer "m". For example in formula (I):

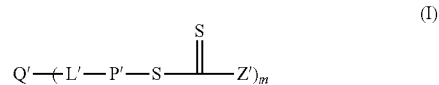
(I)

wherein Q' is m-valent, when m=1, Q' is a monovalent moiety. Likewise, when m=2, Q' is a divalent moiety, and so on.

In the above formulae, m is preferably between 1 and 10.

In one aspect the invention provides a macro-RAFT agent for polymerising one or more ethylenically unsaturated monomers by RAFT polymerisation, the macro-RAFT agent having a conducting segment or a semiconducting segment coupled to a RAFT functional group, wherein the leaving group of the macro-RAFT agent comprises the conducting segment or semiconducting segment.

As used herein the term "macro-RAFT agent" takes its standard meaning in the art.

Given that the polymers of the present invention comprise a polymer segment having an insulating polymer backbone, it will be understood that a wide range of ethylenically unsaturated monomers may be employed. Typically, the polymer produced by polymerising ethylenically unsaturated monomers consists of an optionally substituted poly(ethylene). It will be understood that poly(ethylene) is an insulator. Suitable monomers are those which can be polymerised by a free radical process. The monomers should also be capable of being polymerised with other monomers. The factors which determine copolymerisability of various monomers are well documented in the art. For example, see: Greenlee, R. Z., in Polymer Handbook 3$^{rd}$ Edition (Brandup, J., and Immergut. E. H. Eds) Wiley: New York, 1989 p II/53. Such monomers include those having the general formula (III):

(III)

wherein U and W are independently selected from —CO$_2$H, —CO$_2$R$^2$, —COR$^2$, —CSR$^2$, —CSOR$^2$, —COSR$^2$, —CONH$_2$, —CONHR$^2$, —CONR$^2{}_2$, hydrogen, halogen and optionally substituted C$_1$-C$_4$ alkyl; preferred optional substituents for the C$_1$-C$_4$ alkyl group include those selected from hydroxy, —CO$_2$H, —CO$_2$R$^2$, —COR$^2$, —CSR$^2$, —CSOR$^2$, —COSR$^2$, —CN, —CONH$_2$, —CONHR$^2$, —CONR$^2{}_2$, —OR$^2$, —SR$^2$, —O$_2$CR$^2$, —SCOR$^2$, and —OCSR$^2$; and V is selected from the group consisting of hydrogen, R$^2$, —CO$_2$H, —CO$_2$R$^2$, —COR$^2$, CN, —CSR$^2$, —CSOR$^2$, —COSR$^2$, —CONH$_2$, —CONHR$^2$, —CONR$^2{}_2$, NHC(O)R$^2$, NR$^2$C(O)R$^2$, PO(OR$^2$)$_3$, —OR$^2$, —SR$^2$, —O$_2$CR$^2$, —SCOR$^2$, —OCSR$^2$ and halogen;

wherein the or each R$^2$ is independently selected from optionally substituted C$_1$-C$_{22}$ alkyl, optionally substituted C$_2$-C$_{22}$ alkenyl, C$_2$-C$_{22}$ optionally substituted alkynyl, optionally substituted aryl, optionally substituted heteroaryl, optionally substituted carbocyclyl, optionally substituted heterocyclyl, optionally substituted aralkyl, optionally substituted heteroarylalkyl, optionally substituted alkaryl, optionally substituted alkylheteroaryl and polymer chains; preferred optional substituents for R$^2$ include those selected from alkyleneoxidyl(epoxy), hydroxy, alkoxy, acyl, acyloxy, formyl, alkylcarbonyl, carboxy, sulfonic acid, alkoxy- or aryloxy-carbonyl, isocyanato, cyano, silyl, halo, amino, including salts and derivatives thereof. Preferred polymer chains include, but are not limited to, polyalkylene oxide, polyarylene ether and polyalkylene ether.

In one embodiment, R$^2$ may be an optionally substituted phenyl group. For example, R$^2$ may be a phenyl group substituted with one or more groups selected from the following:

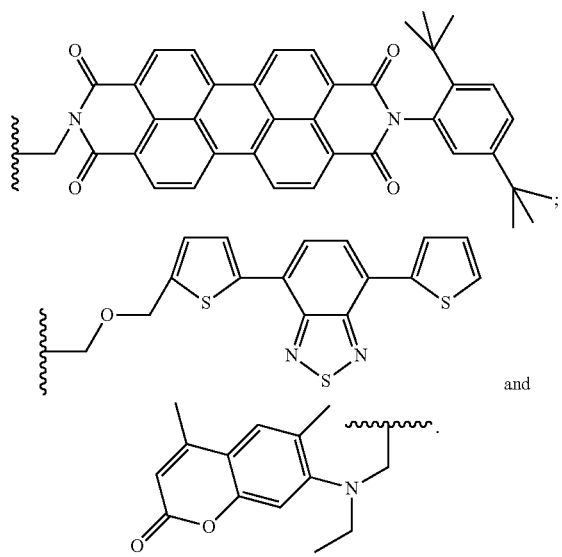

Other examples of monomers include, but are not limited to, maleic anhydride, N-alkylmaleimide, N-arylmaleimide, dialkyl fumarate and cyclopolymerisable monomers, acrylate and methacrylate esters, acrylic and methacrylic acid, styrene and substituted styrene derivatives, acrylamide, methacrylamide, and methacrylonitrile, mixtures of these monomers, and mixtures of these monomers with other monomers. As the polymer chemist would recognise, the choice of comonomers is determined by their steric and electronic properties. The factors which determine copolymerisability of various monomers are well documented in the art. For example, see: Greenlee, R Z. in Polymer Handbook 3$^{rd}$ Edition (Brandup, J., and Immergut, E. H Eds.) Wiley: New York. 1989 pII/53.

Specific examples of useful ethylenically unsaturated monomers include, but are not limited to, the following:

methyl methacrylate, ethyl methacrylate, propyl methacrylate (all isomers), butyl methacrylate (all isomers), 2-ethylhexyl methacrylate, isobornyl methacrylate, methacrylic acid, benzyl methacrylate, phenyl methacrylate, methacrylonitrile, alpha-methylstyrene, methyl acrylate, ethyl acrylate, propyl acrylate (all isomers), butyl acrylate (all isomers), 2-ethylhexyl acrylate, isobornyl acrylate, acrylic acid, benzyl acrylate, phenyl acrylate, acrylonitrile, styrene, functional methacrylates, acrylates and styrenes selected from glycidyl methacrylate, 2-hydroxyethyl methacrylate, hydroxypropyl methacrylate (all isomers), hydroxybutyl methacrylate (all isomers), N,N-dimethylaminoethyl methacrylate, N,N-diethylaminoethyl methacrylate, triethyleneglycol methacrylate, itaconic anhydride, itaconic acid, glycidyl acrylate, 2-hydroxyethyl acrylate, hydroxypropyl acrylate (all isomers), hydroxybutyl acrylate (all isomers), N,N-dimethylaminoethyl acrylate, N,N-diethylaminoethyl acrylate, triethyleneglycol acrylate, methacrylamide, N-methylacrylamide, N,N-dimethylacrylamide, N-tert-butylmethacrylamide, N-n-butylmethacrylamide, N-methylolmethacrylamide, N-ethylolmethacrylamide, N-tert-butylacrylamide, N-n-butylacrylamide, N-methylolacrylamide, N-ethylolacrylamide, vinyl benzoic acid (all isomers), diethylamino styrene (all isomers), alpha-methylvinyl benzoic acid (all isomers), diethylamino alpha-methylstyrene (all isomers), p-vinylbenzene sulfonic acid, p-vinylbenzene sulfonic sodium salt, trimethoxysilylpropyl methacrylate, triethoxysilylpropyl methacrylate, tributoxysilylpropyl methacrylate, dimethoxymethylsilylpropyl methacrylate, diethoxymethylsilylpropyl methacrylate, dibutoxymethylsilylpropyl methacrylate, diisopropoxymethylsilylpropyl methacrylate, dimethoxysilylpropyl methacrylate, diethoxysilylpropyl methacrylate, dibutoxysilylpropyl methacrylate, diisopropoxysilylpropyl methacrylate, trimethoxysilylpropyl acrylate, triethoxysilylpropyl acrylate, tributoxysilylpropylacrylate, dimethoxymethylsilylpropyl acrylate, diethoxymethylsilylpropyl acrylate, dibutoxymethylsilylpropyl acrylate, diisopropoxymethylsilylpropyl acrylate, dimethoxysilylpropyl acrylate, diethoxysilylpropyl acrylate, dibutoxysilylpropyl acrylate, diisopropoxysilylpropyl acrylate, vinyl acetate, vinyl butyrate, vinyl benzoate, vinyl chloride, vinyl fluoride, vinyl bromide, maleic anhydride, N-phenylmaleimide, N-butylmaleimide, N-vinylpyrrolidone, N-vinylcarbazole, butadiene, ethylene, chloroprene, and monomers represented by the following structures:

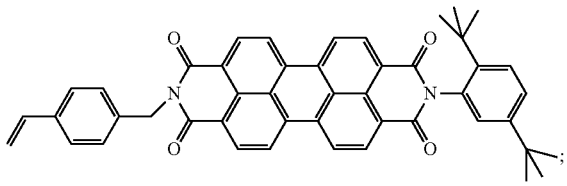

-continued

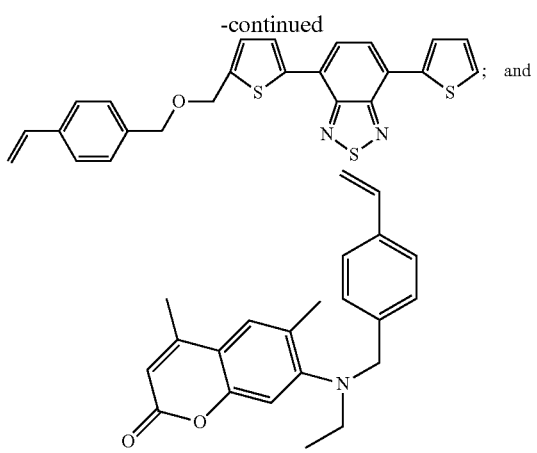

as well as acrylates, methacrylates, acryamides, methacrylamides and other styrene derivatives that are substituted with one or more of the following substituents:

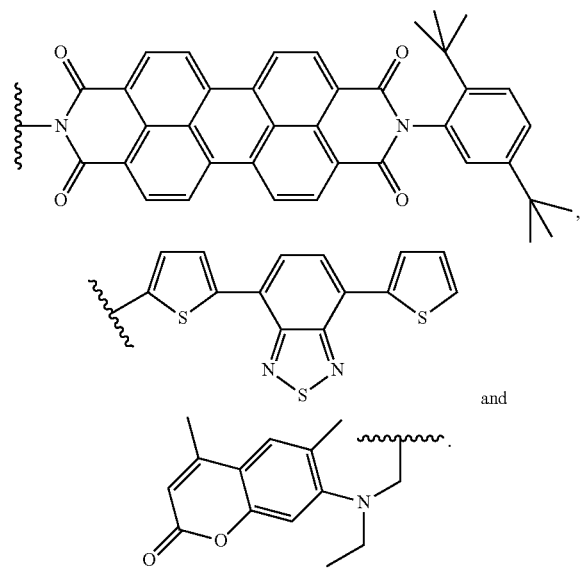

and

According to one aspect of the present invention there is provided especially ethylenically unsaturated monomers, comprising conducting or semiconducting moieties. Without wishing to be limited by theory, it is believed that a polymer segment having an insulating polymer backbone comprising the reaction residue of such monomers may provide for a polymer having a "conductivity gradient". In this respect, a structural conductivity/semiconductivity gradient induces an energy gradient which defines the direction on the polymer along which the charge may move. In other words, tailoring the structural relationship between the conducting/semiconducting segment and the pendant groups of the polymer segment (which may consist of one or more of the conducting/semiconducting moieties above) provides the skilled worker with a degree of control over the conductivity/semiconductivity of the polymer.

Monomers that may be polymerised according to the invention include a mixture of different monomers. Where different monomers are used in accordance with the invention, they may have similar or disparate reactivities. The expression "disparate reactivities" in the context of the ethylenically unsaturated monomers is intended to relate to their relative reactivities. Accordingly, the monomers may be conveniently referred to as being less or more activated. Less activated monomers are generally considered to be those monomers that provide an unstable propagating radical, and more activated monomers are generally considered to be those monomers that provide a stable propagating radical. In the context of RAFT polymerisation, the polymer chemist will appreciate the types of monomers that may be categorised as being less or more activated.

Examples of less activated monomers include, but are not limited to, vinylacetate, N-vinylpyrrolidone, N-vinylcarbazole, vinyl and vinylidene halides, and monomers where V in general formula (III) is selected from $OC(O)R^2$, $OR^2$, $NHC(O)R^2$, $NR^2C(O)R^2$, and halogen.

Examples of more activated monomers include, but are not limited to, styrene, methacrylic monomers, acrylic monomers, and monomers where V in general formula (III) is selected from optionally substituted aryl, $CO_2H$, $CO_2R^2$, $COR^2$, $CN$, $CONH_2$, $PO(OR^2)_3$, $CONHR^2$, and $CONR^2_2$.

As used herein the expression "RAFT polymerisation" takes its standard meaning in the art, and is a technique with which the polymer chemist is familiar. In this respect, RAFT polymerisation is polymerisation of at least one ethylenically unsaturated monomer under the control of a RAFT agent (which may be a macro-RAFT agent).

Polymerisation of the monomers will usually require initiation from a source of free radicals. The source of initiating radicals can be provided by any suitable method of generating free radicals, such as the thermally induced homolytic scission of suitable compound(s) (thermal initiators such as peroxides, peroxyesters, or azo compounds), the spontaneous generation from monomers (e.g. styrene), redox initiating systems, photochemical initiating systems or high energy radiation such as electron beam, X- or gamma-radiation. The initiating system is chosen such that under the reaction conditions there is no substantial adverse interaction of the initiator or the initiating radicals with the macro-RAFT agent or modified macro-RAFT agent under the conditions of the reaction. The initiator ideally should also have the requisite solubility in the reaction medium.

Thermal initiators are chosen to have an appropriate half life at the temperature of polymerisation. These initiators can include one or more of the following compounds:

2,2'-azobis(isobutyronitrile), 2,2'-azobis(2-cyanobutane), dimethyl 2,2'-azobis(isobutyrate), 4,4'-azobis(4-cyanovaleric acid), 1,1'-azobis(cyclohexanecarbonitrile), 2-(t-butylazo)-2-cyanopropane, 2,2'-azobis{2-methyl-N-[1,1-bis(hydroxymethyl)-2-hydroxyethyl]propionamide}, 2,2'-azobis[2-methyl-N-(2-hydroxyethyl)propionamide], 2,2'-azobis(N,N'-dimethyleneisobutyramidine)dihydrochloride, 2,2'-azobis(2-amidinopropane)dihydrochloride, 2,2'-azobis(N,N'-dimethyleneisobutyramidine), 2,2'-azobis{2-methyl-N-[1,1-bis(hydroxymethyl)-2-hydroxyethyl]propionamide}, 2,2'-azobis{2-methyl-N-[1,1-bis(hydroxymethyl)-2-ethyl]propionamide}, 2,2'-azobis[2-methyl-N-(2-hydroxyethyl)propionamide], 2,2'-azobis(isobutyramide)dihydrate, 2,2'-azobis(2,2,4-trimethylpentane), 2,2'-azobis(2-methylpropane), t-butyl peroxyacetate, t-butyl peroxybenzoate, t-butyl peroxyneodecanoate, t-butylperoxy isobutyrate, t-amyl peroxypivalate, t-butyl peroxypivalate, diisopropyl peroxydicarbonate, dicyclohexyl peroxydicarbonate, dicumyl peroxide, dibenzoyl peroxide, dilauroyl peroxide, potassium peroxydisulfate, ammonium peroxydisulfate, di-t-butyl hyponitrite, dicumyl hyponitrite. This list is not exhaustive.

Photochemical initiator systems are chosen to have the requisite solubility in the reaction medium and have an appropriate quantum yield for radical production under the conditions of the polymerisation. Examples include benzoin derivatives, benzophenone, acyl phosphine oxides, and photo-redox systems.

Redox initiator systems are chosen to have the requisite solubility in the reaction medium and have an appropriate rate of radical production under the conditions of the polymerisation; these initiating systems can include, but are not limited to, combinations of the following oxidants and reductants:

oxidants: potassium, peroxydisulfate, hydrogen peroxide, t-butyl hydroperoxide.
reductants: iron (II), titanium (III), potassium thiosulfite, potassium bisulfite.

Other suitable initiating systems are described in recent texts. See, for example, Moad and Solomon "the Chemistry of Free Radical Polymerisation", Pergamon, London, 1995, pp 53-95.

It is understood that the polymer chemist will be familiar with which part (or parts in the case of, for example, a symmetrical trithiocarbonate-containing macro-RAFT agent) of a macro-RAFT agent will act as a leaving group during RAFT polymerisation. The effective radical leaving group was referred to in *Macromolecules,* 1998, 31(16), 5559-5562 as the "R" group. Without wishing to be bound by theory, it is believed that for a given set of conditions (including monomer type, temperature, reaction solvent, etc), the bond that couples the leaving group to the thio group of the RAFT functional group undergoes homolytic cleavage during RAFT polymerisation. The rate at which the bond undergoes homolytic cleavage may depend on the weakness of the chemical bond. A bond's weakness may be modulated by the presence of one or more chemical groups nearby. It is understood that the polymer chemist would be aware of the type of groups that promote homolytic cleavage of a bond. Examples of such groups are electron-withdrawing groups such as carbonyl and cyano groups, as well as electron-donating groups such as alkyl groups (eg methyl group). The bond that is between the thio group of the thiocarbonylthio RAFT functional group and the leaving group will be susceptible to homolytic cleavage under conditions of RAFT polymerisation. An example of a bond which is susceptible to homolytic cleavage under conditions of RAFT polymerisation is shown in the structure below:

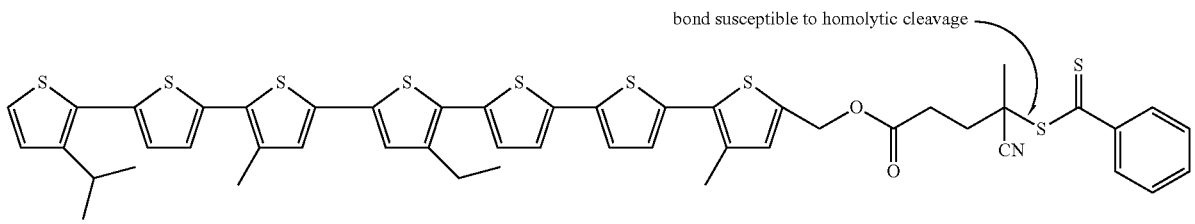 [SMILES: CCc1cc(-c2cc(C)c(-c3ccc(-c4sccc4C(C)C)s3)s2)sc1-c1ccc(-c2ccc(-c3sc(COC(=O)CCC(C)(C#N)SC(=S)c4ccccc4)cc3C)s2)s1]

Under conditions of RAFT polymerisation, homolytic cleavage of the C—S bond indicated in the structure above yields a radical species which is stabilised by the presence of two alkyl groups and a cyano group:

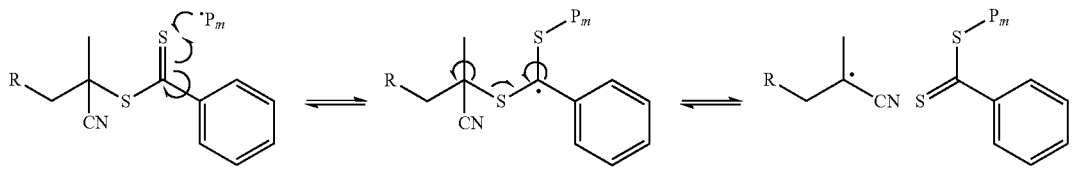

A product of the homolytic cleavage of the C—S bond indicated above is known as the propagating radical species. This species may react with a monomer unit or RAFT functional group during RAFT polymerisation. Fragmentation of the leaving group from the RAFT functional group produces a propagating radical species. In the context of the present invention, the conducting segment forms a part or the whole of the "R" group of the RAFT agent. It is understood that the polymer chemist is familiar with mechanisms which may be used to describe RAFT polymerisation, and will be familiar with the structural and electronic features of propagating radical species. Nonetheless, shown below is a representative scheme for the addition-fragmentation steps of the RAFT polymerisation process:

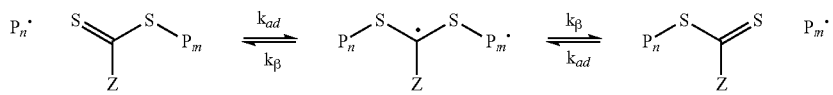

In the scheme, $P_n$, and $P_m$ are examples of propagating radicals.

In one aspect the invention provides a process for producing a polymer by RAFT polymerisation comprising polymerising one or more ethylenically unsaturated monomers under the control of a macro-RAFT agent, said macro-RAFT agent having a conducting segment or semiconducting segment coupled to a RAFT functional group, wherein the leaving group of the macro-RAFT agent comprises the conducting segment or semiconducting segment.

The polymer chemist will be familiar with the RAFT polymerisation process. The polymer chemist will be aware that the polymerisation of one or more ethylenically unsaturated monomers under the control of a macro-RAFT agent, refers to the control of the free radical polymerisation of the monomer(s) imparted by the macro-RAFT agent, and in particular the RAFT functional group and the groups adjacent to the RAFT functional group. The degree of control may depend on a number of factors such as the concentration of the macro-RAFT agent, monomer(s) and initiator, as well as the reaction temperature, etc.

The polymers of the present invention may undergo modification, in particular modification of the RAFT functional group, to produce products wherein the coupling between the polymer segment having an insulating polymer backbone and the conducting or semiconducting segment is maintained. For example, aminolysis of the RAFT functional group in the structure shown below (wherein A, B and C correspond to the units described above) may enable the production of two discrete polymers from one structure:

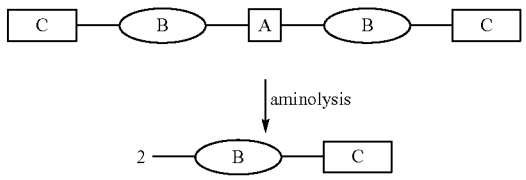

Two examples of cleavage reactions which may be useful in the context of the present invention are given below:

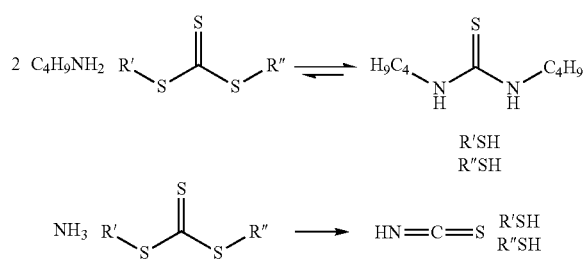

The RAFT functional group may also be cleaved from the conducting segment by other means. For example, reaction of

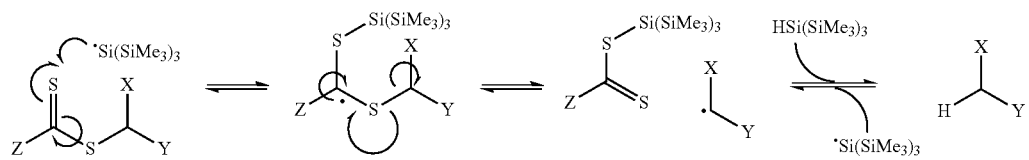

the polymers of the present invention with a radical species (such as tris(trimethylsilyl)silyl radical) may promote homolytic cleavage of a C—S bond producing a hydro-terminated polymer segment (having an insulating polymer backbone) coupled to a conducting or semiconducting segment:

Other methods for the cleavage of RAFT functional groups are described in Farnham, W. B.; Fryd, M.; Moad, G.; Thang, S. H.; Rizzardo, E. Removing sulfur-containing end groups from vinyl polymer without changing solvent WO 2005113612 A1 and Moad, G.; Rizzardo, E.; Thang, S. H. *Polymer* 2008, 49, 1079-1131. In this respect radical-induced reduction is a preferred method of RAFT functional group cleavage.

Accordingly, in a further aspect the present invention provides a process for cleaving a part or whole of the RAFT functional group from the polymer segment (having an insulating polymer backbone) of a polymer comprising a conducting or semiconducting segment coupled to a polymer segment having an insulating polymer backbone and a RAFT functional group coupled to the polymer segment having an insulating backbone, wherein there is no RAFT functional group in between the conducting or semiconducting segment and the polymer segment having an insulating backbone. The present invention also provides the product obtained from such a process. Without wishing to be bound by theory it is believed that RAFT functional groups, and thiol groups obtained from the cleavage of RAFT functional groups, are capable of complexing with nonoparticles.

The present invention also provides a unique class of polymers comprising the reaction residue of at least one ethylenically unsaturated monomer comprising a conducting or semiconducting segment as hereinbefore described. The present invention also provides a method of making this unique class of polymers comprising the step of reacting one or more ethylenically unsaturated monomers comprising a conducting or semiconducting segment such that the polymer comprises the reaction residue of the monomer. For example, the monomers may be polymerised alone or together with one or more other monomers so as to form the polymer. In that case, the polymers may be produced by any conventional polymerisation means including RAFT polymerisation, free radical polymerisation, anionic polymerisation, cationic polymerisation, Atom Transfer Radical Polymerisation (ATRP) and Nitroxide Mediated Polymerisation (NMP). In one embodiment the polymers are produced by RAFT polymerisation.

As used herein, the term "alkyl", used either alone or in compound words denotes straight chain, branched or cyclic alkyl, preferably $C_{1-20}$ alkyl, e.g. $C_{1-10}$ or $C_{1-6}$. Examples of straight chain and branched alkyl include methyl, ethyl, n-propyl, isopropyl, n-butyl, sec-butyl, t-butyl, n-pentyl, 1,2-dimethylpropyl, 1,1-dimethyl-propyl, hexyl, 4-methylpentyl, 1-methylpentyl, 2-methylpentyl, 3-methylpentyl, 1,1-dimethylbutyl, 2,2-dimethylbutyl, 3,3-dimethylbutyl, 1,2-dimethylbutyl, 1,3-dimethylbutyl, 1,2,2-trimethylpropyl, 1,1,2-trimethylpropyl, heptyl, 5-methylhexyl, 1-methylhexyl, 2,2- dimethylpentyl, 3,3-dimethylpentyl, 4,4-dimethylpentyl, 1,2-dimethylpentyl, 1,3-dimethylpentyl, 1,4-dimethyl-pentyl, 1,2,3-trimethylbutyl, 1,1,2-trimethylbutyl, 1,1,3-trimethylbutyl, octyl, 6-methylheptyl, 1-methylheptyl, 1,1,3,3-tetramethylbutyl, nonyl, 1-, 2-, 3-, 4-, 5-, 6- or 7-methyloctyl, 1-, 2-, 3-, 4- or 5-ethylheptyl, 1-, 2- or 3-propylhexyl, decyl, 1-, 2-, 3-, 4-, 5-, 6-, 7- and 8-methylnonyl, 1-, 2-, 3-, 4-, 5- or 6-ethyloctyl, 1-, 2-, 3- or 4-propylheptyl, undecyl, 1-, 2-, 3-, 4-, 5-, 6-, 7-, 8- or 9-methyldecyl, 1-, 2-, 3-, 4-, 5-, 6- or 7-ethylnonyl, 1-, 2-, 3-, 4- or 5-propyloctyl, 1-, 2- or 3-butylheptyl, 1-pentylhexyl, dodecyl, 1-, 2-, 3-, 4-, 5-, 6-, 7-, 8-, 9- or 10-methylundecyl, 1-, 2-, 3-, 4-, 5-, 6-, 7- or 8-ethyldecyl, 1-, 2-, 3-, 4-, 5- or 6-propylnonyl, 1-, 2-, 3- or 4-butyloctyl, 1-2-pentylheptyl and the like. Examples of cyclic alkyl include mono- or polycyclic alkyl groups such as cyclopropyl, cyclobutyl, cyclopentyl, cyclohexyl, cycloheptyl, cyclooctyl, cyclononyl, cyclodecyl and the like. Where an alkyl group is referred to generally as "propyl", butyl" etc, it will be understood that this can refer to any of straight, branched and cyclic isomers where appropriate. An alkyl group may be optionally substituted by one or more optional substituents as herein defined.

The term "alkenyl" as used herein denotes groups formed from straight chain, branched or cyclic hydrocarbon residues containing at least one carbon to carbon double bond including ethylenically mono-, di- or polyunsaturated alkyl or cycloalkyl groups as previously defined, preferably $C_{2-20}$ alkenyl (e.g. $C_{2-10}$ or $C_{2-6}$). Examples of alkenyl include vinyl, allyl, 1-methylvinyl, butenyl, iso-butenyl, 3-methyl-2-butenyl, 1-pentenyl, cyclopentenyl, 1-methyl-cyclopentenyl, 1-hexenyl, 3-hexenyl, cyclohexenyl, 1-heptenyl, 3-heptenyl, 1-octenyl, cyclooctenyl, 1-nonenyl, 2-nonenyl, 3-nonenyl, 1-decenyl, 3-decenyl, 1,3-butadienyl, 1,4-pentadienyl, 1,3-cyclopentadienyl, 1,3-hexadienyl, 1,4-hexadienyl, 1,3-cyclohexadienyl, 1,4-cyclohexadienyl, 1,3-cycloheptadienyl, 1,3,5-cycloheptatrienyl and 1,3,5,7-cyclooctatetraenyl. An alkenyl group may be optionally substituted by one or more optional substituents as herein defined.

As used herein the term "alkynyl" denotes groups formed from straight chain, branched or cyclic hydrocarbon residues containing at least one carbon-carbon triple bond including ethylenically mono-, di- or polyunsaturated alkyl or cycloalkyl groups as previously defined. Unless the number of carbon atoms is specified the term preferably refers to $C_{2-20}$ alkynyl (e.g. $C_{2-10}$ or $C_{2-6}$). Examples include ethynyl, 1-propynyl, 2-propynyl, and butynyl isomers, and pentynyl isomers. An alkynyl group may be optionally substituted by one or more optional substituents as herein defined.

The term "halogen" ("halo") denotes fluorine, chlorine, bromine or iodine (fluoro, chloro, bromo or iodo).

The term "aryl" (or "carboaryl") denotes any of single, polynuclear, conjugated and fused residues of aromatic hydrocarbon ring systems. Examples of aryl include phenyl, biphenyl, terphenyl, quaterphenyl, naphthyl, tetrahydronaphthyl, anthracenyl, dihydroanthracenyl, benzanthracenyl, dibenzanthracenyl, phenanthrenyl, fluorenyl, pyrenyl, idenyl, azulenyl, chrysenyl. Preferred aryl include phenyl and naphthyl. An aryl group may or may not be optionally substituted by one or more optional substituents as herein defined. The term "arylene" is intended to denote the divalent form of aryl.

The term "carbocyclyl" includes any of non-aromatic monocyclic, polycyclic, fused or conjugated hydrocarbon residues, preferably $C_{3-20}$ (e.g. $C_{3-10}$ or $C_{3-8}$). The rings may be saturated, e.g. cycloalkyl, or may possess one or more double bonds (cycloalkenyl) and/or one or more triple bonds (cycloalkynyl). Particularly preferred carbocyclyl moieties are 5-6-membered or 9-10 membered ring systems. Suitable examples include cyclopropyl, cyclobutyl, cyclopentyl, cyclohexyl, cycloheptyl, cyclooctyl, cyclononyl, cyclodecyl, cyclopentenyl, cyclohexenyl, cyclooctenyl, cyclopentadienyl, cyclohexadienyl, cyclooctatetraenyl, indanyl, decalinyl and indenyl. A carbocyclyl group may be optionally substituted by one or more optional substituents as herein defined. The term "carbocyclylene" is intended to denote the divalent form of carbocyclyl.

The term "heteroatom" or "hetero" as used herein in its broadest sense refers to any atom other than a carbon atom which may be a member of a cyclic organic group. Particular examples of heteroatoms include nitrogen, oxygen, sulfur, phosphorous, boron, silicon, selenium and tellurium, more particularly nitrogen, oxygen and sulfur.

The term "heterocyclyl" when used alone or in compound words includes any of monocyclic, polycyclic, fused or conjugated hydrocarbon residues, preferably $C_{3-20}$ (e.g. $C_{3-10}$ or $C_{3-8}$) wherein one or more carbon atoms are replaced by a heteroatom so as to provide a non-aromatic residue. Suitable heteroatoms include O, N, S, P and Se, particularly O, N and S. Where two or more carbon atoms are replaced, this may be by two or more of the same heteroatom or by different heteroatoms. The heterocyclyl group may be saturated or partially unsaturated, i.e. possess one or more double bonds. Particularly preferred heterocyclyl are 5-6 and 9-10 membered heterocyclyl. Suitable examples of heterocyclyl groups may include azridinyl, oxiranyl, thiiranyl, azetidinyl, oxetanyl, thietanyl, 2H-pyrrolyl, pyrrolidinyl, pyrrolinyl, piperidyl, piperazinyl, morpholinyl, indolinyl, imidazolidinyl, imidazolinyl, pyrazolidinyl, thiomorpholinyl, dioxanyl, tetrahydrofuranyl, tetrahydropyranyl, tetrahydropyrrolyl, tetrahydrothiophenyl, pyrazolinyl, dioxalanyl, thiazolidinyl, isoxazolidinyl, dihydropyranyl, oxazinyl, thiazinyl, thiomorpholinyl, oxathianyl, dithianyl, trioxanyl, thiadiazinyl, dithiazinyl, trithianyl, azepinyl, oxepinyl, thiepinyl, indenyl, indanyl, 3H-indolyl, isoindolinyl, 4H-quinolazinyl, chromenyl, chromanyl, isochromanyl, pyranyl and dihydropyranyl. A heterocyclyl group may be optionally substituted by one or more optional substituents as herein defined. The term "heterocyclylene" is intended to denote the divalent form of heterocyclyl.

The term "heteroaryl" includes any of monocyclic, polycyclic, fused or conjugated hydrocarbon residues, wherein one or more carbon atoms are replaced by a heteroatom so as to provide an aromatic residue. Preferred heteroaryl have 3-20 ring atoms, e.g. 3-10. Particularly preferred heteroaryl are 5-6 and 9-10 membered bicyclic ring systems. Suitable heteroatoms include, O, N, S, P and Se, particularly O, N and S. Where two or more carbon atoms are replaced, this may be by two or more of the same heteroatom or by different heteroatoms. Suitable examples of heteroaryl groups may include pyridyl, pyrrolyl, thienyl, imidazolyl, furanyl, benzothienyl, isobenzothienyl, benzofuranyl, isobenzofuranyl, indolyl, isoindolyl, pyrazolyl, pyrazinyl, pyrimidinyl, pyridazinyl, indolizinyl, quinolyl, isoquinolyl, phthalazinyl, 1,5-naphthyridinyl, quinozalinyl, quinazolinyl, quinolinyl, oxazolyl, thiazolyl, isothiazolyl, isoxazolyl, triazolyl, oxadialzolyl, oxatriazolyl, triazinyl, and furazanyl. A heteroaryl group may be optionally substituted by one or more optional substituents as herein defined. The term "heteroarylene" is intended to denote the divalent form of heteroaryl.

The term "acyl" either alone or in compound words denotes a group containing the moiety C=O (and not being a carboxylic acid, ester or amide) Preferred acyl includes $C(O)-R^e$, wherein $R^e$ is hydrogen or an alkyl, alkenyl, alkynyl, aryl, heteroaryl, carbocyclyl, or heterocyclyl residue. Examples of acyl include formyl, straight chain or branched alkanoyl (e.g. $C_{1-20}$) such as acetyl, propanoyl, butanoyl, 2-methylpropanoyl, pentanoyl, 2,2-dimethylpropanoyl, hexanoyl, heptanoyl, octanoyl, nonanoyl, decanoyl, undecanoyl, dodecanoyl, tridecanoyl, tetradecanoyl, pentadecanoyl, hexadecanoyl, heptadecanoyl, octadecanoyl, nonadecanoyl and icosanoyl; cycloalkylcarbonyl such as cyclopropylcarbonyl cyclobutylcarbonyl, cyclopentylcarbonyl and cyclohexylcarbonyl; aroyl such as benzoyl, toluoyl and naphthoyl; aralkanoyl such as phenylalkanoyl (e.g. phenylacetyl, phenylpropanoyl, phenylbutanoyl, phenylisobutylyl, phenylpentanoyl and phenylhexanoyl) and naphthylalkanoyl (e.g. naphthylacetyl, naphthylpropanoyl and naphthylbutanoyl]; aralkenoyl such as phenylalkenoyl (e.g. phenylpropenoyl, phenylbutenoyl, phenylmethacryloyl, phenylpentenoyl and phenylhexenoyl and naphthylalkenoyl (e.g. naphthylpropenoyl, naphthylbutenoyl and naphthylpentenoyl); aryloxyalkanoyl such as phenoxyacetyl and phenoxypropionyl; arylthiocarbamoyl such as phenylthiocarbamoyl; arylglyoxyloyl such as phenylglyoxyloyl and naphthylglyoxyloyl; arylsulfonyl such as phenylsulfonyl and napthylsulfonyl; heterocyclic-carbonyl; heterocyclicalkanoyl such as thienylacetyl, thienylpropanoyl, thienylbutanoyl, thienylpentanoyl, thienylhexanoyl, thiazolylacetyl, thiadiazolylacetyl and tetrazolylacetyl; heterocyclicalkenoyl such as heterocyclicpropenoyl, heterocyclicbutenoyl, heterocyclicpentenoyl and heterocyclichexenoyl; and heterocyclicglyoxyloyl such as thiazolyglyoxyloyl and thienylglyoxyloyl. The $R^e$ residue may be optionally substituted as described herein.

The term "sulfoxide", either alone or in a compound word, refers to a group —S(O)$R^f$ wherein $R^f$ is selected from hydrogen, alkyl, alkenyl, alkynyl, aryl, heteroaryl, heterocyclyl, carbocyclyl, and aralkyl. Examples of preferred $R^f$ include $C_{1-20}$alkyl, phenyl and benzyl.

The term "sulfonyl", either alone or in a compound word, refers to a group S(O)$_2$—$R^f$, wherein $R^f$ is selected from hydrogen, alkyl, alkenyl, alkynyl, aryl, heteroaryl, heterocyclyl, carbocyclyl and aralkyl. Examples of preferred $R^f$ include $C_{1-20}$alkyl, phenyl and benzyl.

The term "sulfonamide", either alone or in a compound word, refers to a group S(O)NR$^f$R$^f$ wherein each $R^f$ is independently selected from hydrogen, alkyl, alkenyl, alkynyl, aryl, heteroaryl, heterocyclyl, carbocyclyl, and aralkyl. Examples of preferred $R^f$ include $C_{1-20}$alkyl, phenyl and benzyl. In a preferred embodiment at least one $R^f$ is hydrogen. In another form, both $R^f$ are hydrogen.

The term, "amino" is used here in its broadest sense as understood in the art and includes groups of the formula NR$^a$R$^b$ wherein R$^a$ and R$^b$ may be any independently selected from hydrogen, alkyl, alkenyl, alkynyl, aryl, carbocyclyl, heteroaryl, heterocyclyl, arylalkyl, and acyl. R$^a$ and R$^b$, together with the nitrogen to which they are attached, may also form a monocyclic, or polycyclic ring system e.g. a 3-10 membered ring, particularly, 5-6 and 9-10 membered systems. Examples of "amino" include NH$_2$, NHalkyl (e.g. $C_{1-20}$alkyl), NHaryl (e.g. NHphenyl), NHaralkyl (e.g. NHbenzyl), NHacyl (e.g. NHC(O)$C_{1-20}$alkyl, NHC(O)phenyl), Nalkylalkyl (wherein each alkyl, for example $C_{1-20}$, may be the same or different) and 5 or 6 membered rings, optionally containing one or more same or different heteroatoms (e.g. O, N and S).

The term "amido" is used here in its broadest sense as understood in the art and includes groups having the formula C(O)NR$^a$R$^b$, wherein R$^a$ and R$^b$ are as defined as above. Examples of amido include C(O)NH$_2$, C(O)NHalkyl (e.g. $C_{1-20}$alkyl), C(O)NHaryl (e.g. C(O)NHphenyl), C(O)NHaralkyl (e.g. C(O)NHbenzyl), C(O)NHacyl (e.g. C(O)NHC(O)$C_{1-20}$alkyl, C(O)NHC(O)phenyl), C(O)Nalkylalkyl (wherein each alkyl, for example $C_{1-20}$, may be the same or different) and 5 or 6 membered rings, optionally containing one or more same or different heteroatoms (e.g. O, N and S).

The term "carboxy ester" is used here in its broadest sense as understood in the art and includes groups having the formula CO$_2$R$^g$, wherein R$^g$ may be selected from groups including alkyl, alkenyl, alkynyl, aryl, carbocyclyl, heteroaryl, heterocyclyl, aralkyl, and acyl. Examples of carboxy ester include CO$_2$$C_{1-20}$alkyl, CO$_2$aryl (e.g. CO$_2$phenyl), CO$_2$aralkyl (e.g. CO$_2$ benzyl).

As used herein, the term "aryloxy" refers to an "aryl" group attached through an oxygen bridge. Examples of aryloxy substituents include phenoxy, biphenyloxy, naphthyloxy and the like.

As used herein, the term "acyloxy" refers to an "acyl" group wherein the "acyl" group is in turn attached through an oxygen atom. Examples of "acyloxy" include hexylcarbonyloxy(heptanoyloxy), cyclopentylcarbonyloxy, benzoyloxy, 4-chlorobenzoyloxy, decylcarbonyloxy(undecanoyloxy), propylcarbonyloxy(butanoyloxy), octylcarbonyloxy (nonanoyloxy), biphenylcarbonyloxy (eg 4-phenylbenzoyloxy), naphthylcarbonyloxy (eg 1-naphthoyloxy) and the like.

As used herein, the term "alkyloxycarbonyl" refers to a "alkyloxy" group attached through a carbonyl group. Examples of "alkyloxycarbonyl" groups include butylformate, sec-butylformate, hexylformate, octylformate, decylformate, cyclopentylformate and the like.

As used herein, the term "arylalkyl" refers to groups formed from straight or branched chain alkanes substituted with an aromatic ring. Examples of arylalkyl include phenylmethyl(benzyl), phenylethyl and phenylpropyl.

As used herein, the term "alkylaryl" refers to groups formed from aryl groups substituted with a straight chain or branched alkane. Examples of alkylaryl include methylphenyl and isopropylphenyl.

In this specification "optionally substituted" is taken to mean that a group may or may not be substituted or fused (so as to form a condensed polycyclic group) with one, two, three or more of organic and inorganic groups, including those selected from: alkyl, alkenyl, alkynyl, carbocyclyl, aryl, heterocyclyl, heteroaryl, acyl, aralkyl, alkaryl, alkheterocyclyl, alkheteroaryl, alkcarbocyclyl, halo, haloalkyl, haloalkenyl, haloalkynyl, haloaryl, halocarbocyclyl, haloheterocyclyl, haloheteroaryl, haloacyl, haloaryalkyl, hydroxy, hydroxyalkyl, hydroxyalkenyl, hydroxyalkynyl, hydroxycarbocyclyl, hydroxyaryl, hydroxyheterocyclyl, hydroxyheteroaryl, hydroxyacyl, hydroxyaralkyl, alkoxyalkyl, alkoxyalkenyl, alkoxyalkynyl, alkoxycarbocyclyl, alkoxyaryl, alkoxyheterocyclyl, alkoxyheteroaryl, alkoxyacyl, alkoxyaralkyl, alkoxy, alkenyloxy, alkynyloxy, aryloxy, carbocyclyloxy, aralkyloxy, heteroaryloxy, heterocyclyloxy, acyloxy, haloalkoxy, haloalkenyloxy, haloalkynyloxy, haloaryloxy, halocarbocyclyloxy, haloaralkyloxy, haloheteroaryloxy, haloheterocyclyloxy, haloacyloxy, nitro, nitroalkyl, nitroalkenyl, nitroalkynyl, nitroaryl, nitroheterocyclyl, nitroheteroaryl, nitrocarbocyclyl, nitroacyl, nitroaralkyl, amino (NH$_2$), alkylamino, dialkylamino, alkenylamino, alkynylamino, arylamino, diarylamino, aralkylamino, diaralkylamino, acylamino, diacylamino, heterocyclamino, heteroarylamino, carboxy, carboxyester, amido, alkylsulphonyloxy, arylsulphenyloxy, alkylsulphenyl, arylsulphenyl, thio, alkylthio, alkenylthio, alkynylthio, arylthio, aralkylthio, carbocyclylthio, heterocyclylthio, heteroarylthio, acylthio, sulfoxide, sulfonyl, sulfonamide, aminoalkyl, aminoalkenyl, aminoalkynyl, aminocarbocyclyl, aminoaryl, aminoheterocyclyl, aminoheteroaryl, aminoacyl, aminoaralkyl, thioalkyl, thioalkenyl, thioalkynyl, thiocarbocyclyl, thioaryl, thioheterocyclyl, thioheteroaryl, thioacyl, thioaralkyl, carboxyalkyl, carboxyalkenyl, carboxyalkynyl, carboxycarbocyclyl, carboxyaryl, carboxyheterocyclyl, carboxyheteroaryl, carboxyacyl, carboxyaralkyl, carboxyesteralkyl, carboxyesteralkenyl, carboxyesteralkynyl, carboxyestercarbocyclyl, carboxyesteraryl, carboxyesterheterocyclyl, carboxyesterheteroaryl, carboxyesteracyl, carboxyesteraralkyl, amidoalkyl, amidoalkenyl, amidoalkynyl, amidocarbocyclyl, amidoaryl, amidoheterocyclyl, amidoheteroaryl, amidoacyl, amidoaralkyl, formylalkyl, formylalkenyl, formylalkynyl, formylcarbocyclyl, formylaryl, formylheterocyclyl, formylheteroaryl, formylacyl, formylaralkyl, acylalkyl, acylalkenyl, acylalkynyl, acylcarbocyclyl, acylaryl, acylheterocyclyl, acylheteroaryl, acylacyl, acylaralkyl, sulfoxidealkyl, sulfoxidealkenyl, sulfoxidealkynyl, sulfoxidecarbocyclyl, sulfoxidearyl, sulfoxideheterocyclyl, sulfoxideheteroaryl, sulfoxideacyl, sulfoxidearalkyl, sulfonylalkyl, sulfonylalkenyl, sulfonylalkynyl, sulfonylcarbocyclyl, sulfonylaryl, sulfonylheterocyclyl, sulfonylheteroaryl, sulfonylacyl, sulfonylaralkyl, sulfonamidoalkyl, sulfonamidoalkenyl, sulfonamidoalkynyl, sulfonamidocarbocyclyl, sulfonamidoaryl, sulfonamidoheterocyclyl, sulfonamidoheteroaryl, sulfonamidoacyl, sulfonamidoaralkyl, nitroalkyl, nitroalkenyl, nitroalkynyl, nitrocarbocyclyl, nitroaryl, nitroheterocyclyl, nitroheteroaryl, nitroacyl, nitroaralkyl, cyano, sulfate, phosphate, triarylmethyl, triarylamino, oxadiazole, and carbazole groups as well as groups represented by the following formulae:

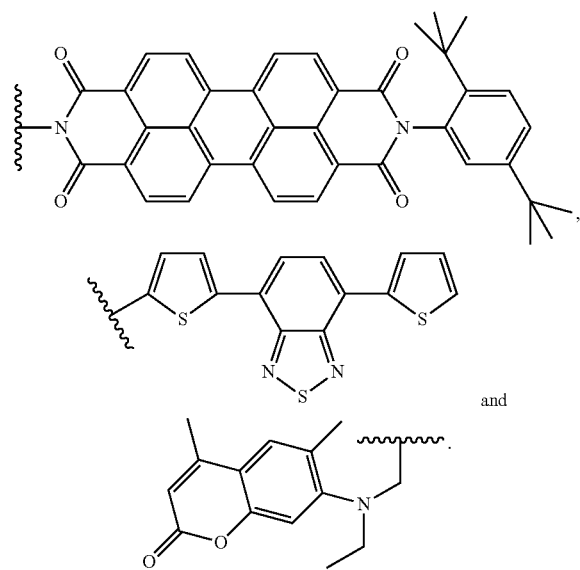

and

Optional substitution may also be taken to refer to where a —CH$_2$— group in a chain or ring is replaced by a group selected from —O—, —S—, NR$^a$—, —C(O)— (i.e. carbonyl), —C(O)O— (i.e. ester), and —C(O)NR$^a$— (i.e. amide), where R$^a$ is as defined herein.

Preferred optional substituents include alkyl, (e.g. C$_{1-6}$ alkyl such as methyl, ethyl, propyl, butyl, cyclopropyl, cyclobutyl, cyclopentyl or cyclohexyl), hydroxyalkyl (e.g. hydroxymethyl, hydroxyethyl, hydroxypropyl), alkoxyalkyl (e.g. methoxymethyl, methoxyethyl, methoxypropyl, ethoxymethyl, ethoxyethyl, ethoxypropyl etc) alkoxy (e.g. C$_{1-6}$ alkoxy such as methoxy, ethoxy, propoxy, butoxy, cyclopropoxy, cyclobutoxy), halo, trifluoromethyl, trichloromethyl, tribromomethyl, hydroxy, phenyl (which itself may be further substituted e.g., by C$_{1-6}$ alkyl, halo, hydroxy, hydroxyC$_{1-6}$ alkyl, C$_{1-6}$ alkoxy, haloC$_{1-6}$alkyl, cyano, nitro OC(O)C$_{1-6}$ alkyl, and amino), benzyl (wherein benzyl itself may be further substituted e.g., by C$_{1-6}$ alkyl, halo, hydroxy, hydroxyC$_{1-6}$alkyl, C$_{1-6}$ alkoxy, haloC$_{1-6}$ alkyl, cyano, nitro OC(O)C$_{1-6}$ alkyl, and amino), phenoxy (wherein phenyl itself may be further substituted e.g., by C$_{1-6}$ alkyl, halo, hydroxy, hydroxyC$_{1-6}$ alkyl, C$_{1-6}$ alkoxy, haloC$_{1-6}$ alkyl, cyano, nitro OC(O)C$_{1-6}$ alkyl, and amino), benzyloxy (wherein benzyl itself may be further substituted e.g., by C$_{1-6}$ alkyl, halo, hydroxy, hydroxyC$_{1-6}$ alkyl, C$_{1-6}$ alkoxy, haloC$_{1-6}$ alkyl, cyano, nitro OC(O)C$_{1-6}$ alkyl, and amino), amino, alkylamino (e.g. C$_{1-6}$ alkyl, such as methylamino, ethylamino, propylamino etc), dialkylamino (e.g. C$_{1-6}$ alkyl, such as dimethylamino, diethylamino, dipropylamino), acylamino (e.g. NHC(O)CH$_3$), phenylamino (wherein phenyl itself may be further substituted e.g., by C$_{1-6}$ alkyl, halo, hydroxy, hydroxyC$_{1-6}$ alkyl, C$_{1-6}$ alkoxy, haloC$_{1-6}$ alkyl, cyano, nitro OC(O)C$_{1-6}$ alkyl, and amino), nitro, formyl, —C(O)-alkyl (e.g. C$_{1-6}$ alkyl, such as acetyl), O—C(O)-alkyl (e.g. C$_{1-6}$alkyl, such as acetyloxy), benzoyl (wherein the phenyl group itself may be further substituted e.g., by C$_{1-6}$ alkyl, halo, hydroxy hydroxyC$_{1-6}$ alkyl, C$_{1-6}$ alkoxy, haloC$_{1-6}$ alkyl, cyano, nitro OC(O)C$_{1-6}$alkyl, and amino), replacement of CH$_2$ with C═O, CO$_2$H, CO$_2$alkyl (e.g. C$_{1-6}$ alkyl such as methyl ester, ethyl ester, propyl ester, butyl ester), CO$_2$-phenyl (wherein phenyl itself may be further substituted e.g., by C$_{1-6}$ alkyl, halo, hydroxy, hydroxyl C$_{1-6}$ alkyl, C$_{1-6}$ alkoxy, halo C$_{1-6}$ alkyl, cyano, nitro OC(O)C$_{1-6}$ alkyl, and amino), CONH$_2$, CONHphenyl (wherein phenyl itself may be further substituted e.g., by C$_{1-6}$ alkyl, halo, hydroxy, hydroxyl C$_{1-6}$ alkyl, C$_{1-6}$ alkoxy, halo C$_{1-6}$ alkyl, cyano, nitro OC(O)C$_{1-6}$ alkyl, and amino), CONHbenzyl (wherein benzyl itself may be further substituted e.g., by C$_{1-6}$ alkyl, halo, hydroxy hydroxyl C$_{1-6}$ alkyl, C$_{1-6}$ alkoxy, halo C$_{1-6}$ alkyl, cyano, nitro OC(O) C$_{1-6}$ alkyl, and amino), CONHalkyl (e.g. C$_{1-6}$ alkyl such as methyl ester, ethyl ester, propyl ester, butyl amide) CONHdialkyl (e.g. C$_{1-6}$ alkyl) aminoalkyl (e.g., HN C$_{1-6}$ alkyl-, C$_{1-6}$alkylHN—C$_{1-6}$ alkyl- and (C$_{1-6}$ alkyl)$_2$N—C$_{1-6}$ alkyl-), thioalkyl (e.g., HS C$_{1-6}$ alkyl-), carboxyalkyl (e.g., HO$_2$CC$_{1-6}$ alkyl-), carboxyesteralkyl (e.g., C$_{1-6}$ alkylO$_2$CC$_{1-6}$ alkyl-), amidoalkyl (e.g., H$_2$N(O)CC$_{1-6}$ alkyl-, H(C$_{1-6}$ alkyl)N(O) CC$_{1-6}$ alkyl-), formylalkyl (e.g., OHCC$_{1-6}$alkyl-), acylalkyl (e.g., C$_{1-6}$ alkyl(O)CC$_{1-6}$ alkyl-), nitroalkyl (e.g., O$_2$NC$_{1-6}$ alkyl-), sulfoxidealkyl (e.g., R(O)SC$_{1-6}$ alkyl, such as C$_{1-6}$ alkyl(O)SC$_{1-6}$ alkyl-), sulfonylalkyl (e.g., R(O)$_2$SC$_{1-6}$ alkyl- such as C$_{1-6}$ alkyl(O)$_2$SC$_{1-6}$ alkyl-), sulfonamidoalkyl (e.g., $_2$HRN(O)SC$_{1-6}$ alkyl, H(C$_{1-6}$ alkyl)N(O)SC$_{1-6}$ alkyl-), triarylmethyl, triarylamino, oxadiazole, and carbazole as well as groups represented by the following formulae:

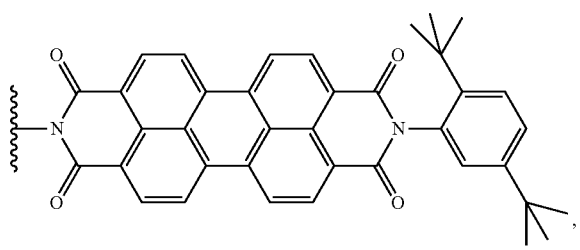

-continued

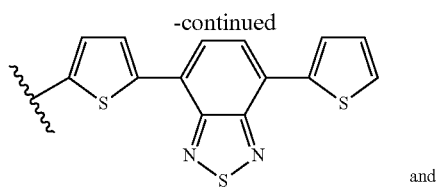

and

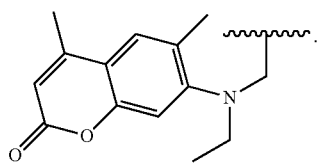

The invention will now be described with reference to the following non-limiting examples:

Example 1

Materials and Instruments

AIBN (TCI) was recrystallised from methanol. 2-(3-methyl-thien-2-yl)-4,4,5,5-tetramethyl-[1,3,2]dioxaborolane (Cremer, J.; Mena-Osteritz, E.; Pschierer, N. G.; Mullen, K.; Bauerle, P. *Org. Biomol. Chem.* 2005, 3, 985), 5,5'-dibromo-2,2'-bithiophene (Bauerle, P.; Pfau, F.; Schlupp, H.; Wurthner, F.; Gaudl, K.-U.; Carot, M. B.; Fischer, P. *J. Chem. Soc. Perkin Trans.* 1993, 2, 489) and 4-(butylthiocarbonothioylthio)-4-cyanopentanoic acid (RAFT-Acid) (Thang, S. H.; Chong, Y. K. B.; Mayadunne, R. T. A.; Moad, G.; Rizzardo, E. *Tetrahedron Lett.* 1999, 40, 2435) were prepared according to published literature methods. All other starting materials were obtained from Aldrich and were used as received. Analytical thin-layer chromatography (TLC) was performed using aluminium sheets pre-coated with silica gel (60 Å pore size, Merck TLC Silica gel 60 F254) impregnated with a fluorescent indicator (254 nm). TLC plates were visualized by exposure to ultraviolet light (UV) at 254 and 365 nm. Steady state fluorescence spectra were recorded on a Varian Cary Eclipse fluorometer. The optical density of the solutions for fluorescence measurements was kept below 0.10 at the excitation wavelength. Fluorescence and excitation spectra were corrected for the wavelength dependence of detector sensitivity and excitation light source output.

$^1$H and $^{13}$C NMR spectra were recorded on a Bruker Av400 spectrometer ($^1$H 400.13 MHz; $^{13}$C 100.63 MHz) at 25° C. in deuterated solvents as stated. Proton chemical shifts are expressed in parts per million (ppm, δ scale) downfield from tetramethylsilane and are referenced to residual protonated NMR solvent signal. Carbon chemical shifts are expressed in parts per million (ppm, δ scale) downfield from tetramethylsilane and are referenced to the carbon resonance of the NMR solvent Spectra. Multiplicities of $^1$H NMR are reported as singlet (s), doublet (d), or triplet (t), with combinations as necessary (such as dd), or multiplet (m), prefixed as broad (b) where appropriate. Homonuclear coupling constants (J) are reported in Hertz (Hz). Molecular weights of polymer were characterized by gel permeation chromatography (GPC) performed in tetrahydrofuran (THF, 1.0 mL/min) at 25° C. using a Waters GPC instrument, with a Waters 2414 Refractive Index Detector, a series of four Polymer Laboratories PLGe1 columns (3×5 μm Mixed-C and 1×3 μm Mixed-E), and Empower Software. The GPC was calibrated with narrow polydispersity polystyrene standards (Polymer Laboratories EasiCal, MW from 264 to 256,000), and molecular weights are reported as polystyrene equivalents.

Synthesis of RAFT Agent

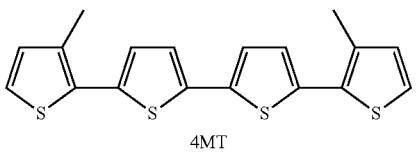 [SMILES: Cc1ccsc1-c1ccc(-c2ccc(-c3sccc3C)s2)s1]

4MT 3,3'''-dimethyl(2,2':5',2'':5'',2'''-quaterthiophene) (4MT)

A solution of 5,5'-dibromo-2,2'-bithiophene (2.7 g, 8.3 mmol) and 2-(3-methyl-thien2-yl)-4,4,5,5-tetramethyl-[1,3,2]dioxaborolane (4.1 g, 18.3 mmol) in 100 mL of toluene and 80 mL N,N-dimethylformamide (DMF) was carefully degassed by bubbling nitrogen through the solution. Next, 12.6 g (55 mmol) of tripotassium phosphate monohydrate dissolved in 70 mL water was added. The resulting emulsion was degassed, and the catalyst system (Pd$_2$ dba$_3$ [186.6 mg, 0.18 mmol], [HP(t-Bu)$_3$]BF$_4$ [105 mg, 0.36 mmol]) was added. Afterwards, the mixture was stirred at room temperature overnight. After removal of the toluene solvent by reduced pressure, the mixture was poured into water (300 mL) and was extracted with chloroform (3×40 mL). The organic phase was washed with water (30 mL), dried over magnesium sulfate, and the solvent was removed in vacuo. Purification by flash silica gel column chromatography [hexane:ethyl acetate=4:1 (v/v)] followed by recrystallization from hexane/dichloromethane (DCM) yielded yellow crystals of 4MT (2.6 g, 87.5%).

$^1$H NMR (CDCl$_3$): δ=7.15 (d, J=5.2 Hz, 2H, 5,5'''-H), 7.13 (d, J=3.8 Hz, 2H, 3',4''-H), 7.05 (d, 2H, J=3.8 Hz, 4',3''-H), 6.89 (d, J=5.2 Hz, 2 H, 4,4'''-H), 2.43 (s, 6H, —CH$_3$).

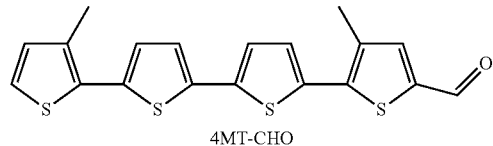 [SMILES: Cc1ccsc1-c1ccc(-c2ccc(-c3sc(C=O)cc3C)s2)s1]

4MT-CHO 4,3'''-dimethyl(5,2':5',2'':5'',2'''-quaterthiophene)-2-carbaldehyde (4MT-CHO)

Phosphorus oxychloride (1.04 g, 6.8 mmol) was slowly added into a solution of 4MT (2.41 g, 6.73 mmol) and DMF (0.51 mL, 6.8 mmol) dissolved in 50 mL DCM. The mixture was stirred for 15 min at room temperature and then heated at 70° C. for 2 h. The dark red solution was then cooled and poured into ice water and neutralized (pH=7) through the addition of potassium hydroxide. The organic layer was separated and the water phase three times extracted with DCM (30 mL). The combined organic phases were consecutively washed with sodium bicarbonate and brine solution and dried over MgSO$_4$. Purification by silica gel column chromatography with n-hexane:ethylacetate in a ratio 4:1 (v/v) gave red crystals of 4MT-CHO (1.35 g, 52%).

$^1$H NMR (CDCl$_3$): δ=9.81 (s, 1H, —CHO), 7.54 (s, 1H, 3-H), 7.24 (d, J=3.8 Hz, 1H, 3'-H), 7.17 (m, 3H, 4',4", 5'-H), 7.06 (d, J=3.9 Hz, 1H, 3"-H), 6.90 (d, 1H, J=5.1 Hz, 4'"-H), 2.48 (s, 3H, 4-CH$_3$), 2.43 (s, 3H, 3'"-CH$_3$).

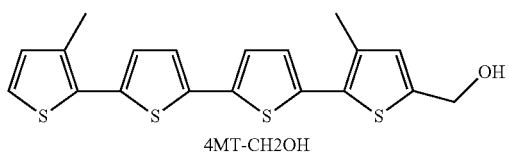 [SMILES: Cc1ccsc1-c1ccc(-c2ccc(-c3sc(CO)cc3C)s2)s1]

4MT-CH2OH

[4,3'"-dimethyl(5,2':5',2":5",2'"-quaterthiophene)-2-yl]methanol (4MT-CH2OH)

To a suspension of 4MT-CHO (1.35 g, 3.5 mmol) in 30 mL dry ethanol was added 265 mg (7 mmol) sodium borohydride in small portions. The reaction mixture quickly changed color from orange to yellow and the stirring was continued for 30 min. Removal of the solvent under reduced pressure followed by purification with flash silica gel column chromatography using chloroform as eluent yielded yellow crystals (1.32 g, 97.2%).

$^1$H NMR (CDCl$_3$): δ=7.15 (d, J=5.2 Hz, 1H, 5'"-H), 7.13 (dd, J=3.8 Hz, 2H, 3',4"-H), 7.05 (d, 1H, J=3.8 Hz, 4'-H), 7.02 (d, 1H, J=3.8 Hz, 3"-H), 6.89 (d, J=5.2 Hz, 1H, 4'"-H), 6.81 (s, 1H, 3-H), 4.77 (s, 2H, —OCH$_2$), 2.43 (s, 3H, 3'"-CH$_3$), 2.38 (s, 3H, 4-CH$_3$).

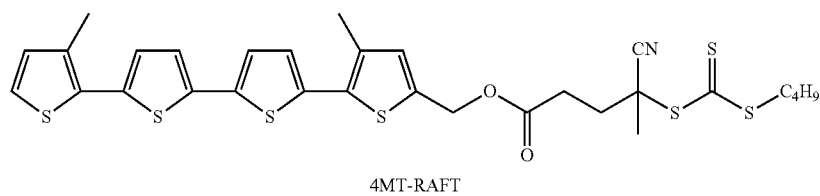

4MT-RAFT

[4,3'"-dimethyl(5,2':5',2":5",2'"-quaterthiophene)-2-yl]methyl-4-(butylthiocarbonothioylthio)-4-cyano-pentanoate (4MT-RAFT)

A mixture of RAFT-Acid (0.53 g, 1.81 mmol) and DCC (0.41 g, 1.98 mmol) was dissolved in dichloromethane (10 mL). After stirring for 15 minutes, a solution of 4MT-CH2OH (0.64 g, 1.65 mmol) and DMAP (8 mg, 0.07 mmol) in dichloromethane (10 mL) was added dropwise. A precipitate was formed immediately. After 4 h, the precipitate was filtered and washed with dichloromethane (5 mL). The filtrate was concentrated by rotary evaporation. The red crude product was further purified by silica gel column chromatography with ethyl acetate:n-hexane=1:4 (v/v) as the eluent to afford the title compound as a yellow viscous oil (1.05 g, 96.3% yield).

$^1$H NMR (CDCl$_3$): δ=7.15 (d, J=5.2 Hz, 1H, 5'"-H), 7.13 (dd, J=3.8 Hz, 2H, 3',4"-H), 7.05 (dd, 2H, J=3.8 Hz, 4',3"-H), 6.89 (d, J=5.2 Hz, 1H, 4'"-H), 6.88 (s, 1H, 3H), 5.22 (s, 2H, —OCH$_2$), 3.33 (t, 2H, J=7.5 Hz, —SCH$_2$), 2.67 (m, 2H, C(O)CH$_2$), 2.56 (m, 1H, CH$_2$CMeCN), 2.43 (s, 3H, 3"-CH$_3$), 2.41 (m, 1H, CH$_2$CMeCN), 2.38 (s, 3H, 4-CH$_3$), 1.87 (s, 3H, C(CN)CH$_3$), 1.68 (m, 2H, SCH$_2$CH$_2$), 1.43 (m, 2H, SCH$_2$CH$_2$CH$_2$), 0.93 (t, 3H, J=7.5 Hz, SCH$_2$CH$_2$CH$_2$CH$_3$).
$^{13}$C (CDCl$_3$): δ=216.9, 171.2, 137.0, 136.4, 135.8, 135.0, 134.9, 134.2, 133.8, 132.9, 132.6, 131.5, 130.8, 126.3, 126.1, 124.0, 123.8, 123.4, 119.0, 77.2, 61.0, 46.3, 36.7, 33.8, 29.8, 29.7, 24.8, 22.1, 15.5, 13.6.

Example 2

Poly(3-hexylthiophene) RAFT agent (where n may be a positive integer such as 4, 7, 10) is prepared analogously to the 4MT-RAFT agent of Example 1:

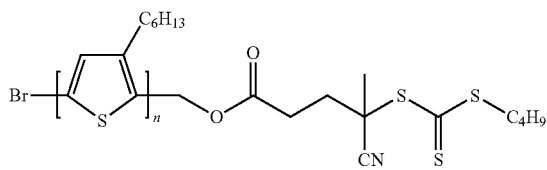

Example 3

Prior to polymerization, all monomers [styrene (St), acrylic acid (AA), methyl acrylate (MA), and methyl methacrylate (MMA)] were flash distilled. Mixtures of monomer, AIBN and RAFT agent were degassed through three freeze-pump-thaw cycles, sealed under vacuum and heated in a constant-temperature oil bath for the stated time. Polymerisation was terminated by rapid cooling. The conversion was calculated by $^1$H NMR. The polymers were then precipitated three times by addition into a rapidly stirred large excess of non-solvent (methanol for St and n-hexane for MA and MMA), filtered, washed with non-solvent, and dried in vacuum to constant mass. The polymers obtained from AA were purified by removal of the monomers under reduced pressure and successive drying in vacuum to a constant weight. The structures of the polymers are illustrated in Chart 1 and the conditions and conversions of the polymerisation are shown in Table 1.

Chart 1

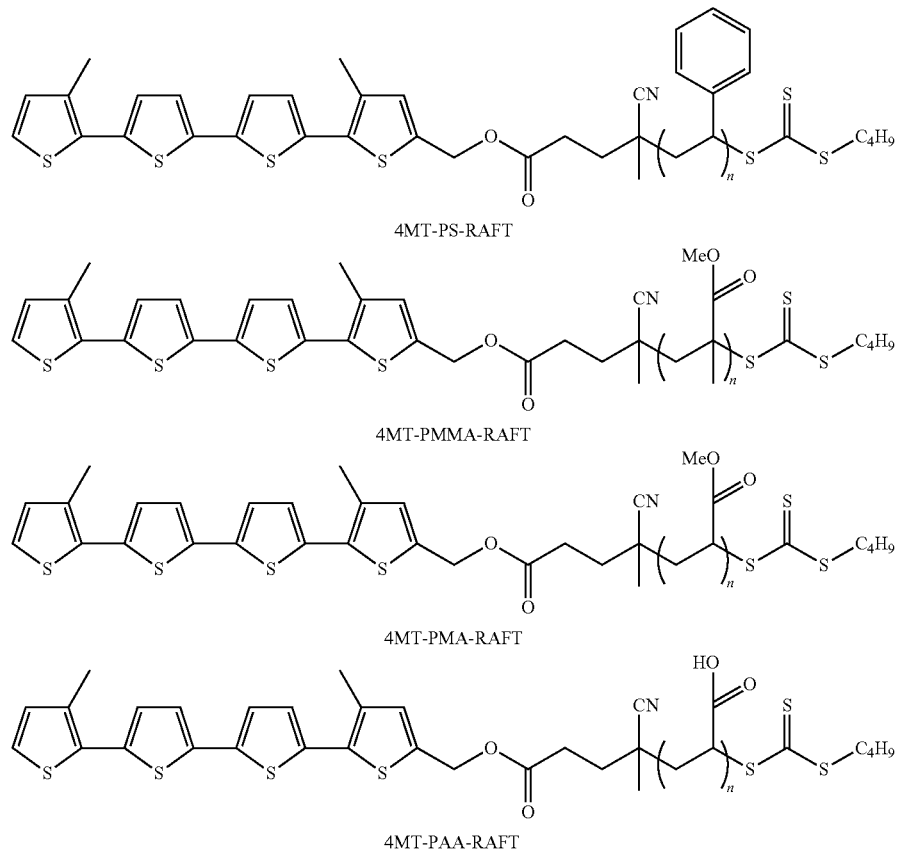

4MT-PS-RAFT

4MT-PMMA-RAFT

4MT-PMA-RAFT

4MT-PAA-RAFT

TABLE 1

Conditions[a] and conversions for the polymerisations of monomers

| | Molar Feed Ratio | | | | Conv.[b] |
|---|---|---|---|---|---|
| | Monomer | 4MT-RAFT | AIBN | Time | (%) |
| 4MT-PS-RAFT | 1577 | 8.2 | 1 | 16 h | 41 |
| 4MT-PMMA-RAFT | 1640 | 8.2 | 1 | 16 h | 91 |
| 4MT-PMA-RAFT | 1907 | 8.2 | 1 | 16 h | 76 |
| 4MT-PAA-RAFT | 2278 | 8.2 | 1 | 6 h | 26 |

[a]Bulk polymerization carried out at 70° C.
[b]Conversions estimated from $^1$H NMR.

TABLE 2

Molecular weights of vinyl polymers.

| | $M_n$ by calculation[a] | $M_n$ by GPC[b] | |
|---|---|---|---|
| | | $M_n$ | $M_w/M_n$ |
| 4MT-PS-RAFT | 8,900 | 12,000 | 1.10 |
| 4MT-PMMA-RAFT | 18,900 | 11,000 | 1.20 |
| 4MT-PMA-RAFT | 15,900 | 23,900 | 1.24 |
| 4MT-PAA-RAFT | 5,900 | 11,400 (9,500)[c] | 1.11 |

[a]Theoretical molecular weights were calculated from $^1$H NMR using the expression $M_n$(calc) = ([monomer]/[RAFT agent]) × conversion yield × MW of monomer + MW of RAFT agent.
[b]Molecular weights estimated against polystyrene standards.
[c]Molecular weight estimated by GPC after esterification of acid functionalities with $CH_2N_2$ (Organic Synthesis, Collective Volume 2, A revised edition of annual Volumes X-XIX, Ed. A. H. Blatt, John Wiley & Sons, p 164, p 461). Value in bracket: converted molecular weight for free acid.

Example 4

Polymerisation of PSPDI under the control of 4MT-RAFT agent produces the poly(PSPDI) derivatised poly(thiophene) polymer shown below (where n equals the number average degree of polymerisation of PSPDI):

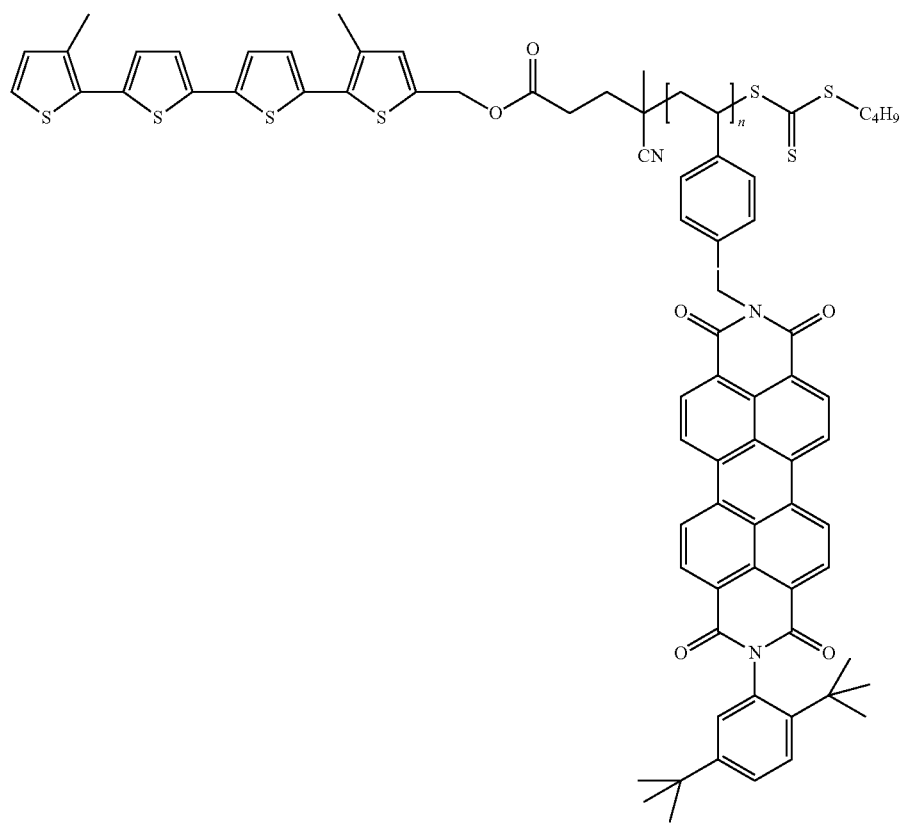

Example 5

Polymerisation of styrene under the control of poly(3-hexylthiophene) RAFT agent produces the poly(styrene) derivatised poly(3-hexylthiophene)polymer shown below (where n may be a positive integer such as 4, 7, 10; and m equals the number average degree of polymerisation of styrene):

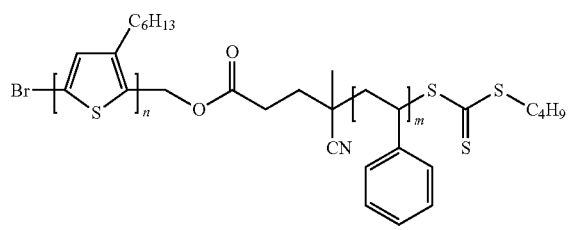

Example 6

Likewise, polymerisation of methyl acrylate under the control of poly(3-hexylthiophene) RAFT agent produces poly(methyl acrylate) derivatised poly(3-hexylthiophene)polymer shown below (where n may be a positive integer such as 4, 7, 10; and m equals the number average degree of polymerisation of methyl acrylate):

Example 7

Likewise, polymerisation of methyl methacrylate under the control of poly(3-hexylthiophene) RAFT agent produces poly(methyl methacrylate) derivatised poly(3-hexylthiophene)polymer shown below (where n may be a positive integer such as 4, 7, 10; and m equals the number average degree of polymerisation of methyl methacrylate):

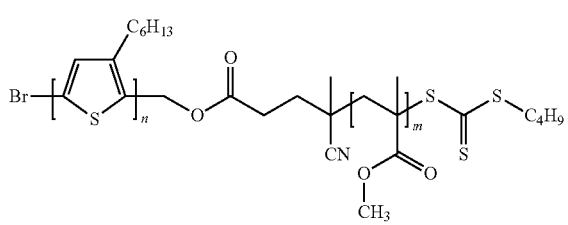

Example 8

Likewise, polymerisation of acrylic acid under the control of poly(3-hexylthiophene) RAFT agent produces poly (acrylic acid) derivatised poly(3-hexylthiophene)polymer shown below (where n may be a positive integer such as 4, 7, 10; and m equals the number average degree of polymerisation of acrylic acid):

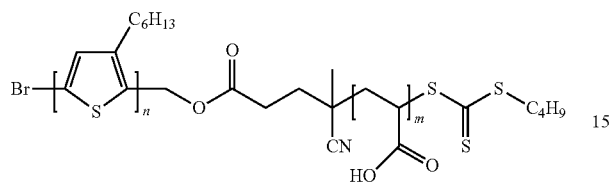

Example 9

Likewise, polymerisation of PSPDI under the control of poly(3-hexylthiophene) RAFT agent produces poly(PSPDI) derivatised poly(3-hexylthiophene)polymer shown below (where n may be a positive integer such as 4, 7, 10; and m equals the number average degree of polymerisation of PSPDI):

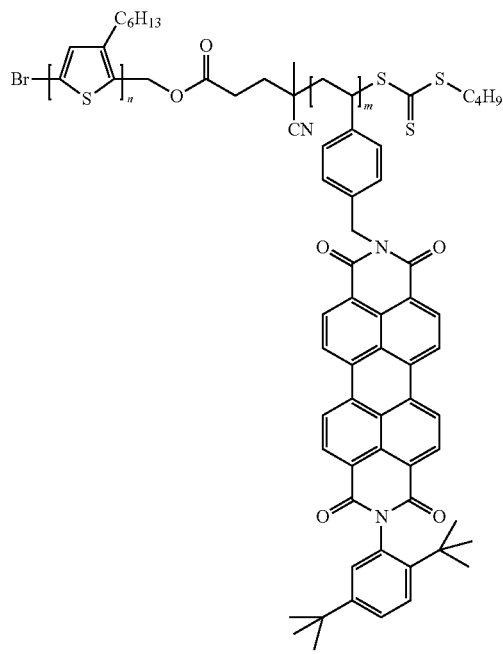

Example 10

Synthesis of RAFT Agent MHA108 (No Ester Linkage)

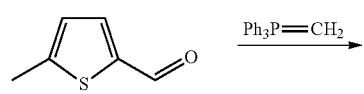

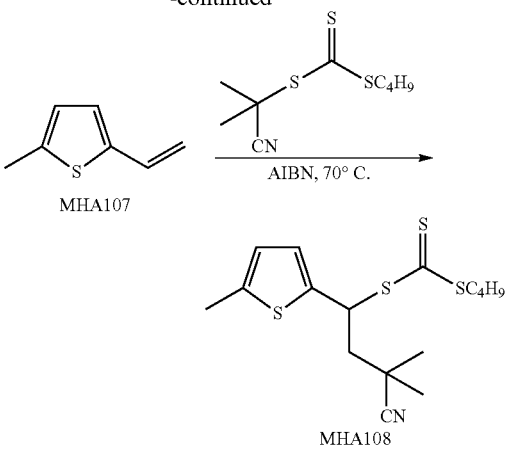

Intermediate 2-Methyl-5vinylthiophene (MHA107)

To a solution of methyltriphenylphosphonium bromide (8.5 g, 23.8 mmol) in 40 mL THF was added 13.9 mL butyl lithium (1.6 M solution in hexane). The resulting solution was stirred for 3 h, after which 2.0 g (15.9 mmol) of 5-methylthiophene-2-carbaldehyde dissolved in 10 mL THF was added. The reaction mixture was stirred overnight, after which it was stopped by pouring into 500 mL ice water. The product was extracted with diethyl ether, washed with brine and dried over magnesium sulphate. Flash column chromatography on silica gel using hexane/chloroform (5:1) gave 0.38 g (19.1%) of 2-methyl-5-vinylthiophene (MHA107). $^1$H NMR (CDCl$_3$): δ=6.76 (d, 1H), 6.70 (dd, 1H), 6.60 (d, 1H), 5.43 (d, 1H), 5.04 (d, 1H), 2.45 (s, 3H).

RAFT Agent (MHA108)

A polymerization tube was charged with 375 mg (3.02 mmol) of MHA107, 705 mg (3.02 mmol) of butyl 2-cyanopropan-2-yl-carbonotrithioate, and 5 mg (0.03 mmol) AIBN. The mixture was degassed through three freeze-pump-thaw cycles, sealed under vacuum and heated in a constant-temperature oil bath at 70° C. for 20 h. The product was purified by silica gel flash column chromatography using hexane/chloroform (5:1) as the eluent and isolated in 67.6% (730 mg) yield. $^1$H NMR (CDCl$_3$): δ=6.91 (d, 1H), 6.60 (d, 1H), 5.64 (dd, 1H), 3.35 (t, 3H), 2.45 (s, 3H), 2.33 (m, 2H), 1.67 (tt, 2H), 1.42 (m, 5H), 1.30 (s, 3H), 0.93 (t, 3H).

Example 11

Synthesis of P3HT-Macro-RAFT Agent MHB 16

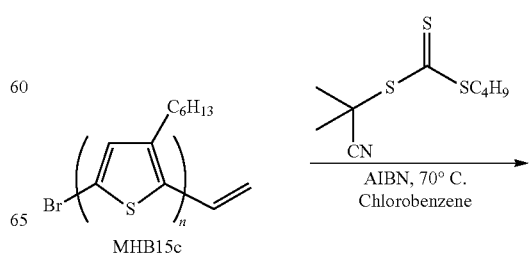

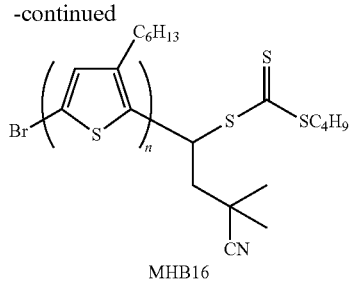

MHB16

P3HT-RAFT (MHB16)

A polymerization tube was charged with 120 mg (2.44× $10^{-5}$ mol) of vinyl-end-functionalized P3HT (MHB15c), 11.4 mg (4.9×$10^{-5}$ mol) of butyl 2-cyanopropan-2-yl-carbonotrithioate, 0.082 mg (5×$10^{-7}$ mol) AIBN, and 1.35 mL chlorobenzene. The mixture was degassed through three freeze-pump-thaw cycles, sealed under vacuum and heated in a constant-temperature oil bath at 70° C. for 20 h. The RAFT agent was then precipitated three times by addition into a rapidly stirred large excess of methanol, filtered, washed with methanol, and dried in vacuum to constant mass. $^1$H NMR (CDCl$_3$): δ=6.96 (s), 3.38 (t), 2.8 (m), 2.57 (m), 1.72 (m), 1.45 (m), 1.38 (m), 0.94 (m).

Macro-RAFT agent MHB16 is an example of a macro-RAFT agent of the present invention which comprises a conducting segment (the thiophene repeat units) coupled to a RAFT functional group (a trithiocarbonate group) wherein the leaving group of the macro-RAFT agent comprises a conducting segment.

Example 12

Polymerization of Styrene

Polymerisation of styrene under the control of RAFT agents MHA108 or MHB16 produce polymers MHA110 and MHB17 (respectively) shown below (where m may be a positive integer such as 4, 7, 10; and n equals the number average degree of polymerisation of styrene):

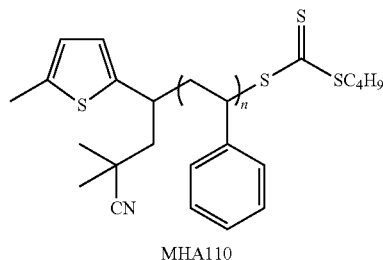

MHA110

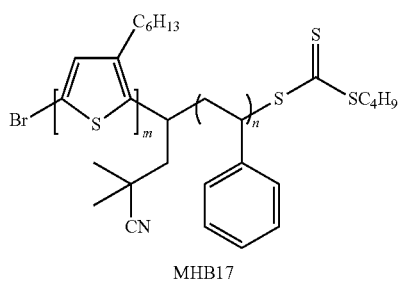

MHB17

| RAFT Agent | Molar Feed Ratio | | | T (° C.) | t (h) | Conv. (%) | $M_n$ | $M_w/M_n$ |
| --- | --- | --- | --- | --- | --- | --- | --- | --- |
| | Styrene | RAFT | AIBN | | | | | |
| 1 MHA108 | 500 | 10 | 1 | 70 | 16 | 0 | — | — |
| 2 MHA108 | 5000 | 10 | 1 | 70 | 16 | 22.0 | 11,820 | 1.10 |
| 3 MHA108 | 5000 | 10 | 1 | 70 | 16 | 17.0 | 12,750 | 1.11 |
| 4 MHA108 | 5000 | 10 | — | 110 | 16 | 41.0 | 24,040 | 1.11 |
| 5 MHB16 | 2000 | 4 | 1 | 70 | 20 | 56.5 | 86,580 | 1.12 |

This case illustrates the invention in which the polymer segment (styrene repeat units) comprising an insulating polymer backbone separates the conducting segment (thiophene repeat units) from the RAFT functional group (trithiocarbonate group).

Example 13

Use of the Polymers of the Present Invention in Device Fabrication

A mixture of 10 mg of P3HT, 1 mg of MHB17 and 10 mg of [6,6]-phenyl-C61-butyric acid methyl ester (PCBM) were dissolved in 1 mL chlorobenzene. The solution was filtered (0.2 μm) and deposited by spin coating onto a PEDOT:PSS coated ITO glass. The device was transferred (without exposure to air) to a vacuum evaporator in an adjacent glovebox. A layer of Al (100 nm) was deposited by thermal evaporation at pressures below 2×$10^{-6}$ mbar. The device was then annealed on a hotplate in the glovebox at 110° C. for 10 min.

Having fabricated the device the electro active properties of these polymers may be determined by way of measuring external quantum efficiencies and Incident Photo to charge Carrier Efficiency (IPCE), as illustrated in Example 21. Examples of these types of diblock copolymers have been tested as compatibilisers in solar cells in Rajaram et al (*Chem. Mater.*, 2009, 21(9), 1775-1777) and have been found to provide efficiencies of 0.55% and external quantum efficiencies of 19%.

Example 14

Light Harvesting Polymers

The following RAFT agents, 1 or 2, were used to make block copolymers using the typical techniques exemplified in the previous examples.

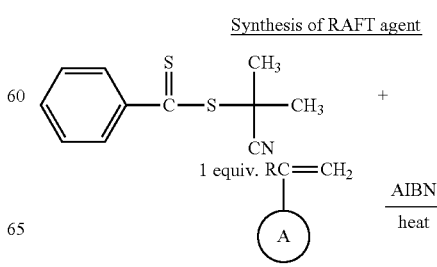

Synthesis of RAFT agent

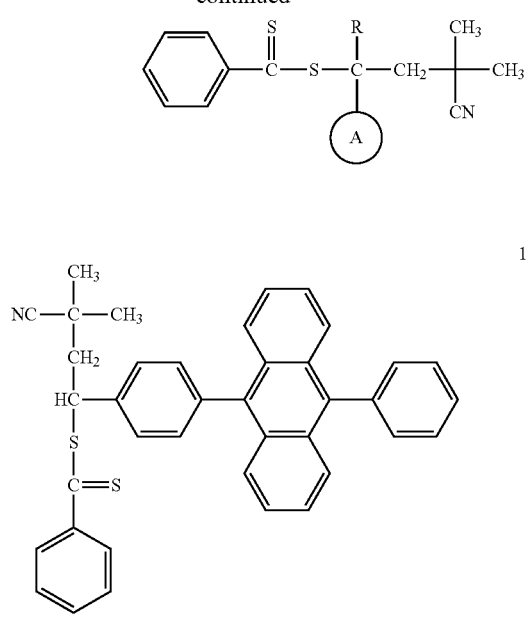

1

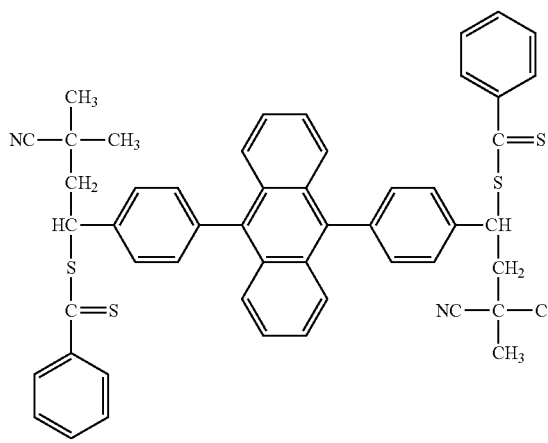

2

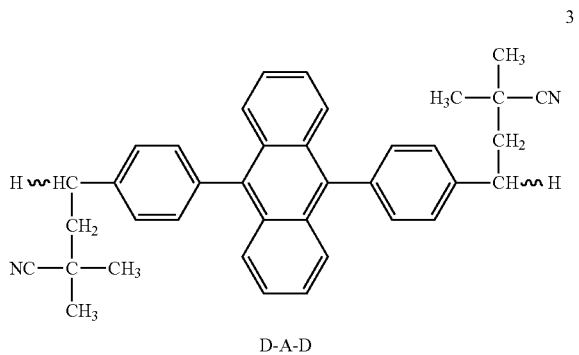

3

Light-harvesting RAFT-Polymers
-Position of Acceptor-

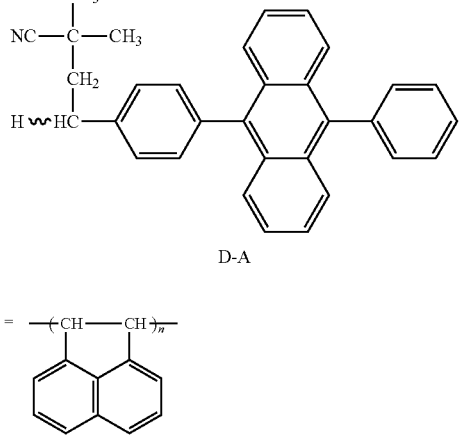

D-A

Characterisation data demonstrates that with similar donor/acceptor ratio (60 vs. 57), a higher excitation energy transfer efficiency (80% vs. 61%) occurs to a diphenylanthracenyl acceptor incorporated at the centre (3), rather than the end (4), of an acenaphthylene polymer.

Example 15

Linear and Star-Shaped Light-Harvesting Polymers

Compared to the linear polymer (5), higher transfer efficiencies can be realised in the star polymer (6) containing a higher density of chromophores within the Förster critical energy transfer distance of the acceptor.

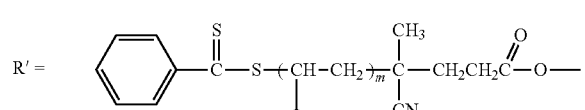

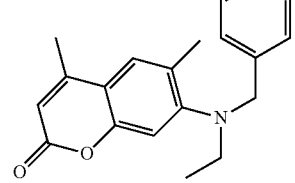

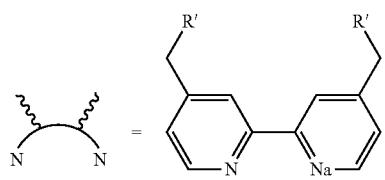

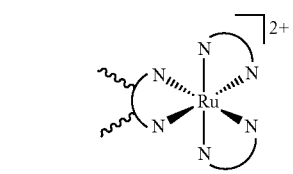

5

-continued

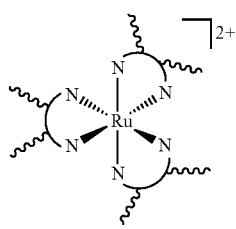

6

TABLE 1

Excitation energy transfer efficiencies in the polymers

|  | 5 | 6 |
|---|---|---|
| Total D/A ratio | 50 | 96 |
| D/A ratio in each arm | 25 | 16 |
| EET efficiency (%) | 25 | 60 |

Example 16

Synthesis of St-TBT Monomer

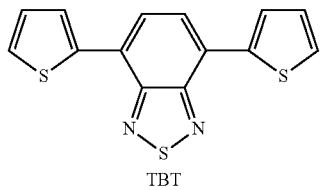

4,7-Di(thiophen-2-yl)benzo[c][1,2,5]thiadiazole (TBT)

A solution of 4,7-dibromobenzo[c][1,2,5]thiadiazole (3.0 g, 10.2 mmol) and thiophen-2-ylboronic acid (2.87 g, 22.4 mmol) in 150 mL of 1,2-dimethoxyethane and 50 mL anhydrous ethanol was carefully degassed by bubbling nitrogen through the solution. Next, 7.16 g (67.2 mmol) of sodium carbonate dissolved in 30 mL water was added. The resulting emulsion was degas sed, and the catalyst Pd(PPh$_3$)$_4$ (200 mg, 0.17 mmol) was added. Afterwards, the mixture was refluxed under nitrogen overnight. After removal of the organic solvent by reduced pressure, the mixture was poured into water (300 mL) and was extracted with chloroform (3×40 mL). The organic phase was washed with water (30 mL), dried over magnesium sulphate, and the solvent was removed in vacuo. Purification by flash silica gel column chromatography [hexane:chloroform=1:1 (v/v)] followed by recrystallization from hexane/dichloromethane (DCM) yielded orange crystals of TBT (2.6 g, 84.9%).

$^1$H NMR (CDCl$_3$): δ=8.12 (d, 2H, J=3.8 Hz, 3,3' T-H), 7.88 (s, 2H, 5,6 B—H), 7.46 (d, 2H, J=5.1 Hz, 5,5' T-H), 7.21 (dd, 2H, J=5.1 and 3.8 Hz, 4,4' T-H).

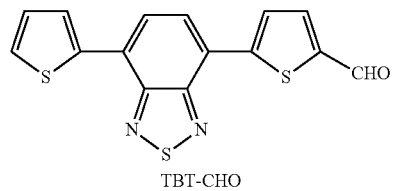

5-(7-(Thiophen-2-yl)benzo[c][1,2,5]thiadiazol-4-yl)thiophene-2-carbaldehyde (TBT-CHO)

Phosphorus oxychloride (0.16 ml, 1.8 mmol) was slowly added into a solution of TBT (0.5 g, 1.65 mmol) and n-methyl formanilide (0.22 mL, 1.8 mmol) dissolved in 15 mL DCM. The mixture was stirred for 15 min at room temperature and then heated at 70° C. overnight. After cooling to room temperature 50 ml saturated sodium acetate solution was added to the dark red solution and stirrer for 15 min. The resulting mixture was poorer into ice water and neutralized (pH=7) through the addition of potassium hydroxide. The organic layer was separated and the water phase three times extracted with DCM (30 mL). The combined organic phases were consecutively washed with sodium bicarbonate and brine solution and dried over MgSO$_4$. Purification by silica gel column chromatography with hexane:chloroform in a ratio 1:1 (v/v) gave red crystals of TBT-CHO (0.5 g, 91.1%).

$^1$H NMR (CDCl$_3$): δ=9.98 (s, 1H, —CHO), 8.21 (d, 1H, J=4.1 Hz, 4 T-H), 8.18 (d, 1H, J=3.8 Hz, 3' T-H), 8.0 (d, 1H, J=7.7 Hz, 5 B—H), 7.92 (d, 1H, J=7.7 Hz, 6 B—H), 7.85 (d, 1H, J=4.1 Hz, 3 T-H), 7.51 (d, 1H, J=5.1 Hz, 5' T-H), 7.23 (dd, 1H, J=5.1 and 3.8 Hz, 4' T-H).

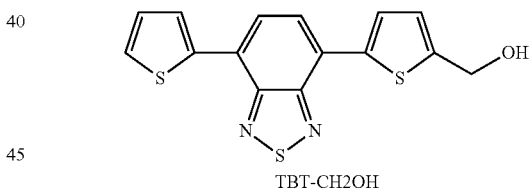

(5-(7-(Thiophen-2-yl)benzo[c][1,2,5]thiadiazol-4-yl)thiophen-2-yl)methanol (TBT-CH$_2$OH)

To a solution of TBT-CHO (1.4 g, 4.27 mmol) in 80 mL THF and 5 mL dry ethanol was added 163.4 mg (4.3 mmol) sodium borohydride in small portions. The reaction mixture quickly changed color from red to orange and the stirring was continued for 20 min. Removal of the solvent under reduced pressure followed by purification with flash silica gel column chromatography using chloroform as eluent yielded orange crystals (1.4 g, 99.4%).

$^1$H NMR (CDCl$_3$): δ 8.12 (d, 1H, J=3.8 Hz, 4 T-H), 7.98 (d, 1H, J=3.8 Hz, 3' T-H), 7.88 (d, 1H, J=7.6 Hz, 5 B—H), 7.84 (d, 1H, J=7.6 Hz, 6 B—H), 7.46 (d, 1H, J=5.2 Hz, 5' T-H), 7.21 (dd, 1H, J=5.1 and 3.8 Hz, 4' T-H), 7.11 (d, 1H, J=3.8 Hz, 3 T-H), 4.91 (s, 2H, —OCH$_2$).

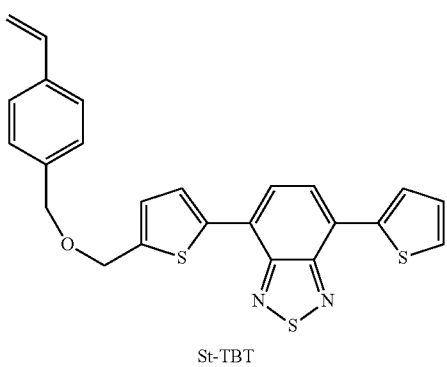 [SMILES: C=Cc1ccc(COCc2ccc(-c3ccc(-c4cccs4)c4nsnc34)s2)cc1]

St-TBT

4-(Thiophen-2-yl)-7-(5-((4-vinylbenzyloxy)methyl)thiophen-2-yl)benzo[c][1,2,5]thiadiazole (St-TBT)

To a solution of 1.37 g (4.15 mmol) of TBT-CH$_2$OH and 0.71 mL (5 mmol) of vinylbenzyl chloride in 60 mL DMF was added 200 mg (8.3 mmol) sodium hydride. The mixture was stirred at room temperature overnight, poured into 300 mL water and extracted with DCM (3×30 mL). The combined organic phases were consecutively washed with water and brine solution and dried over MgSO$_4$. Purification by silica gel column chromatography with hexane:chloroform in a ratio 3:1 (v/v) gave orange powder of St-TBT (1.2 g, 64.8%).

$^1$H NMR (CDCl$_3$): δ 8.12 (d, 1H, J=3.5 Hz, 4 T-H), 7.98 (d, 1H, J=3.8 Hz, 3' T-H), 7.88 (d, 1H, J=7.6 Hz, 5 B—H), 7.84 (d, 1H, J=7.6 Hz, 6 B—H), 7.46 (d, 1H, J=5.2 Hz, 5' T-H), 7.42 (d, 2H, J=8.1, 3 Ph-H), 7.42 (d, 2H, J=8.1, 2 Ph-H), 7.22 (dd, 1H, J=5.2 and 3.8 Hz, 4' T-H), 7.10 (d, 1H, J=3.5 Hz, 3 T-H), 6.73 (dd, 1H, J=17.6 and 10.9 Hz, =CHH), 5.76 (d, 1H, J=17.6 Hz, =CHH), 5.25 (d, 1H, J=10.9 Hz, CH=CH$_2$), 4.77 (s, 2H, —OCH$_2$T), 4.62 (s, 2H, —OCH$_2$Ph).

Example 17

Polymerisation of St-TBT produces the P(St-TBT) polymer shown below (where n equals the number average degree of polymerisation of St-TBT):

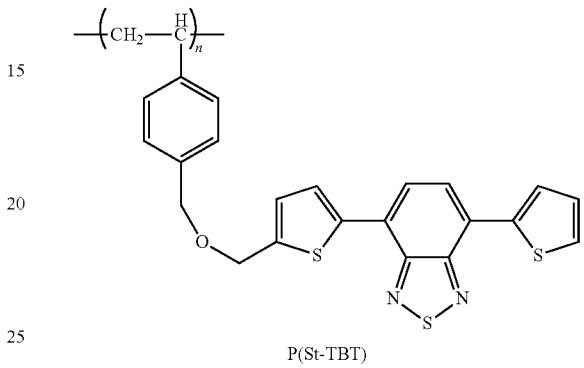

P(St-TBT)

$M_n$=8,600, $M_w/M_n$=1.5

This polymer is hereinafter referred to as MM2.

Example 18

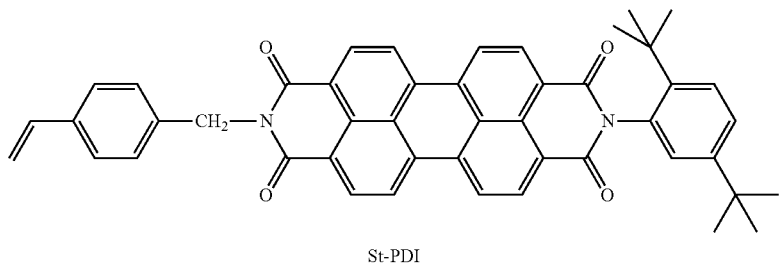 [SMILES: C=Cc1ccc(CN2C(=O)c3ccc4c5ccc6c7c(ccc(c8ccc(c3c48)C2=O)c75)C(=O)N(c2cc(C(C)(C)C)ccc2C(C)(C)C)C6=O)cc1]

St-PDI

N'-(di-2,5-tert-butylphenyl)-N-(4-vinylbenzyl) perylene diimide (St-PDI)

St-PDI was obtained similarly to St-TBT from N-(di-2,5-tert-butylphenyl)perylene diimide and vinylbenzyl chloride in the presence of K$_2$CO$_3$ after 16 h at 70° C. in DMF.

Example 19

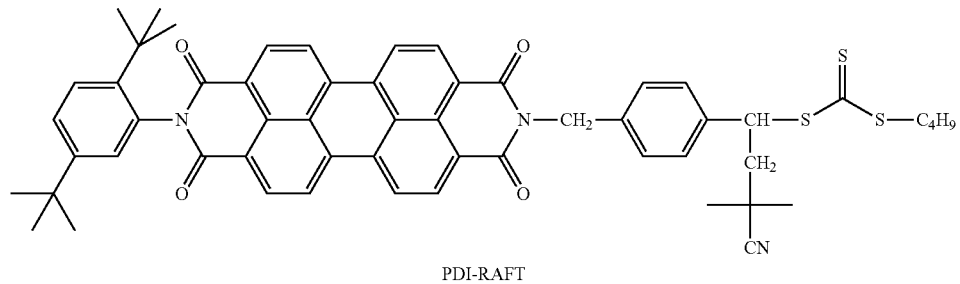

PDI-RAFT

PDI-RAFT was prepared by a modified polymerisation from St-PDI and butyl 2-cyanopropan-2-yl carbonotrithioate in a molar ratio of 1:1 in the presence of 5 mol % AIBN.

Example 20

Polymerisation of St-TBT under the control of PDI-RAFT agent produces the PDI-P(St-TBT)-RAFT polymer shown below (where n equals the number average degree of polymerisation of St-TBT):

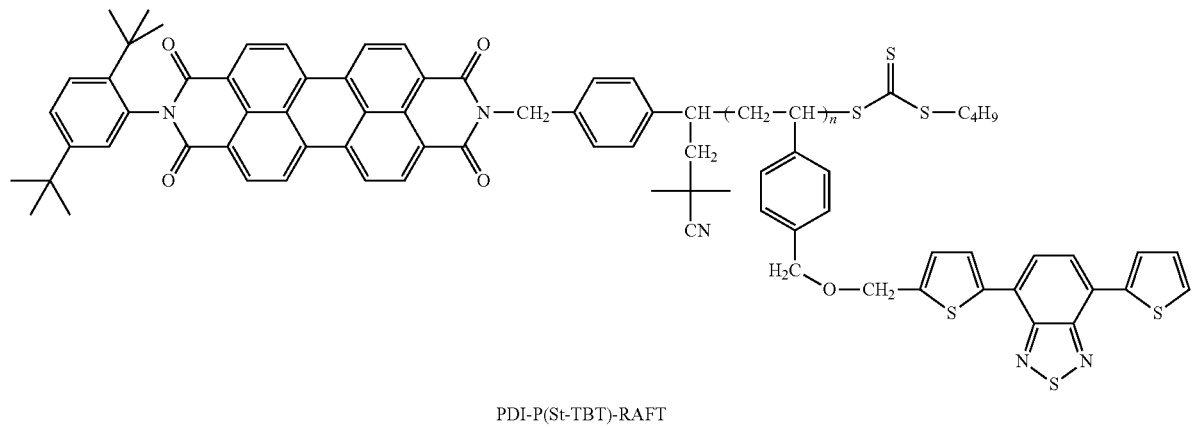

PDI-P(St-TBT)-RAFT $M_n$=3,200, $M_w/M_n$=1.2
This polymer is hereinafter referred to as MM 1.

Example 21

Polymers MM1 and MM2 were tested for their ability to act as solar cell components. The types of experiments described herein are commonly used methodologies that may routinely be adopted by those skilled in the art to demonstrate the ability of conducting and semiconducting organic materials. In typical experiments polymer blends are spin coated from solvent. The determination of the incident photon to current efficiency (IPCE) or external quantum efficiency in prototype devices is helpful in providing evidence of electron transfer from the polymer through a photocurrent action spectrum which correlates with the absorption spectrum of a polymer.

UV-ozone cleaning was performed using a Novascan PDS-UVT, UV/ozone cleaner with the platform set to maximum height, the intensity of the lamp is greater than 36 mW/cm² at a distance of 100 cm. At ambient conditions the ozone output of the UV cleaner is greater than 50 ppm.

Aqueous solutions of Poly(3,4-ethylenedioxythiophene)/poly(4-styrenesulfonic acid) PEDOT/PSS were deposited in air using a Laurell WS-400B-6NPP Lite single wafer spin processor. Polymer blends were deposited inside a glovebox using an SCS G3P Spincoater. Film thicknesses were determined using a Dektak 6M Profilometer. Vacuum depositions were carried out using an Edwards 501 evaporator inside a glovebox. Samples were placed on a shadow mask in a tray with a source to substrate distance of approximately 25 cm. The area defined by the shadow mask gave device areas of 0.1 cm². Deposition rates and film thicknesses were measured using a calibrated quartz thickness monitor inside the vacuum chamber. Al (3 pellets of 99.999% K J Lesker) was evaporated from an open tungsten boat.

ITO coated glass (Kintek, 15 Ω/m) was cleaned by standing in a stirred solution of 5% (v/v) Deconex 12PA detergent at 90° C. for 20 mins. The ITO was then successively sonicated for 10 mins each in distilled water, acetone and isopropanol. The substrates were then exposed to a UV-ozone clean (at RT) for 10 mins. The PEDOT/PSS(HC Starck, Baytron P AI 4083) was filtered (0.2 µm) and deposited by spin coating at 5000 rpm for 60 sec to give a 38 nm layer. The PEDOT/PSS layer was then annealed on a hotplate in the glovebox at 145° C. for 10 mins. Solutions of the polymer blends were deposited onto the PEDOT/PSS layer by spin coating inside a glovebox ($H_2O$ and $O_2$ levels both <1 ppm). Spinning conditions and film thicknesses were optimised for each blend.

For MM1+PCBM (10 mg of MM1 and 10 mg of [6,6]-phenyl-$C_{61}$-butyric acid methyl ester (PCBM) in 1 cm³ chlorobenzene) the solution was filtered (0.2 µm) and deposited by spin coating at 700 rpm (acceleration=13608 rpm) to give a film thickness of 65 nm. For MM2+PCBM (10 mg of MM2 and 10 mg of PCBM in 1 cm³ chlorobenzene) the solution was filtered (0.2 µm) and deposited by spin coating at 1000 rpm (acceleration=13608 rpm) to give a film thickness of 90 nm. For MM2 (10 mg of MM2 in 0.5 cm³ chlorobenzene) the solution was filtered (0.2 µm) and deposited by spin coating at 1000 rpm (acceleration=13608 rpm) to give a film thickness of 100 nm. The devices were transferred (without exposure to air) to a vacuum evaporator in an adjacent glovebox. A layer of Al (100 nm) was deposited by thermal evaporation at pressures below $2\times10^{-6}$ mbar. The devices were then annealed on a hotplate in the glovebox at 110° C. for 10 min.

Completed devices were encapsulated with glass and a UV-cured epoxy (Lens Bond type J-91) by exposing to 254 nm UV-light inside a glovebox ($H_2O$ and $O_2$ levels both <1 ppm) for 10 mins. Prior to electrical testing a small amount of silver paint (Silver Print II, GC electronics, Part no.: 22-023) was deposited onto the connection points of the electrodes. Electrical connections were made using alligator clips.

The cells were tested with an Oriel solar simulator fitted with a 1000 W Xe lamp filtered to give an output of 100 mW/cm² at AM 1.5. The lamp was calibrated using a standard, filtered Si cell from Peccell limited (The output of the lamp was adjusted to give a $J_{SC}$ of 0.605 mA).

IPCE data was collected using an Oriel 150 W Xe lamp coupled to a monochromator and an optical fibre. The output of the optical fibre was focussed to give a beam that was contained within the area of the device. The IPCE was calibrated with a standard, unfiltered Si cell.

51

For both the solar simulator and the IPCE measurements devices were operated using a Keithley 2400 Sourcemeter controlled by Labview Software.

The measurements on the solar simulator gave the cell efficiency under AM 1.5 illumination. The measurements on the IPCE setup gave them cell efficiency at individual wavelengths.

This device methodology has the ability to determine the individual contributions from each component of the block co-polymers.

Results

The IPCE spectrum for MM1 is shown in FIG. 1.

Figure 2:
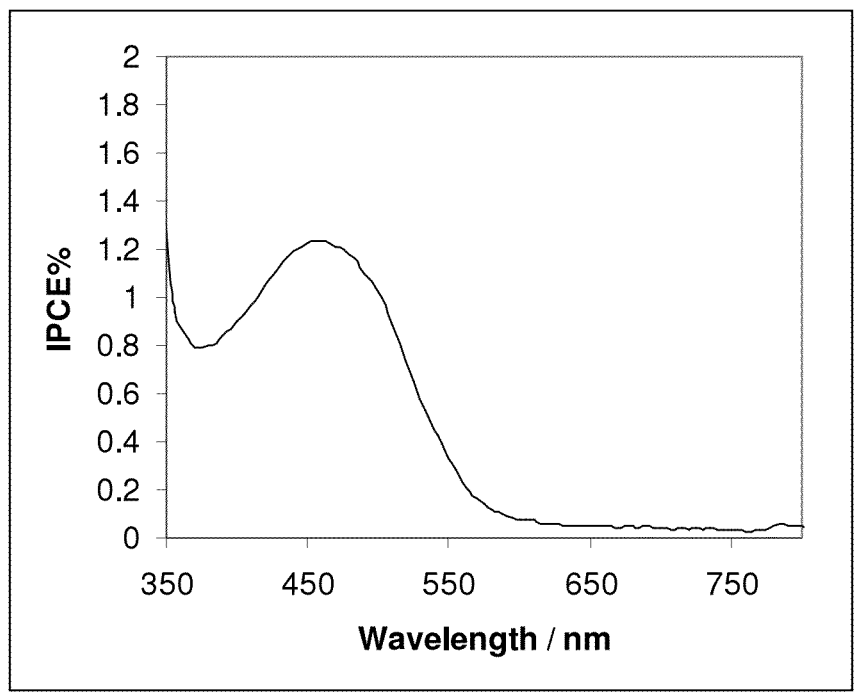
FIG. 2 shows the IPCE spectrum for MM2.

The IPCE spectrum for MM2 is shown in FIG. 2.

Figure 3:
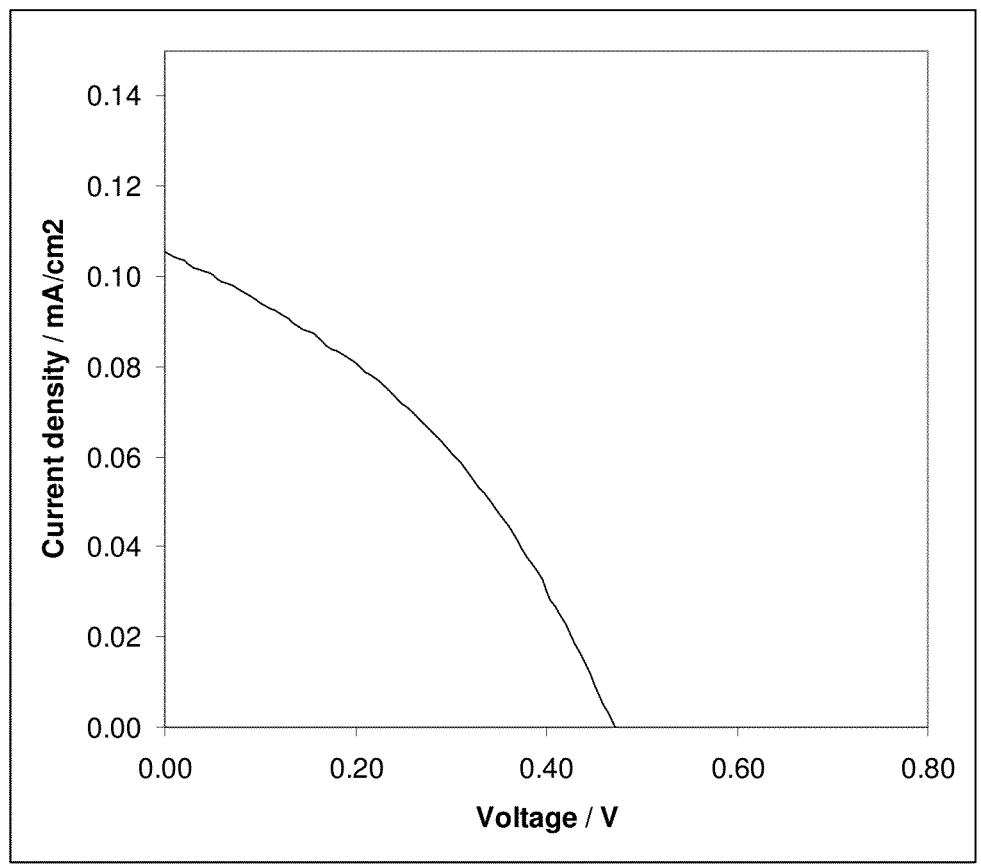
FIG. 3 shows the response of a device using MM2 under AM 1.5 illumination.

The response of a device using MM2 under AM 1.5 illumination is shown in FIG. 3.

Example 22

Cyano-poly(phenylenevinylene)polymers (CN-PPV) are known for their strong emission and use in light emitting polymers. In this experiment, a polymer incorporating a CN-PPV-type motif (which may be referred to as a cyano-substituted stilbene moiety) as a pendant group was synthesised using uncontrolled radical polymerisation.

In the first instance a fragment of a CN-PPV polymer is isolated and converted into a free radical polymerizable monomer or "radically monomerised". This type of structure is readily synthesised from relatively cheap starting materials.

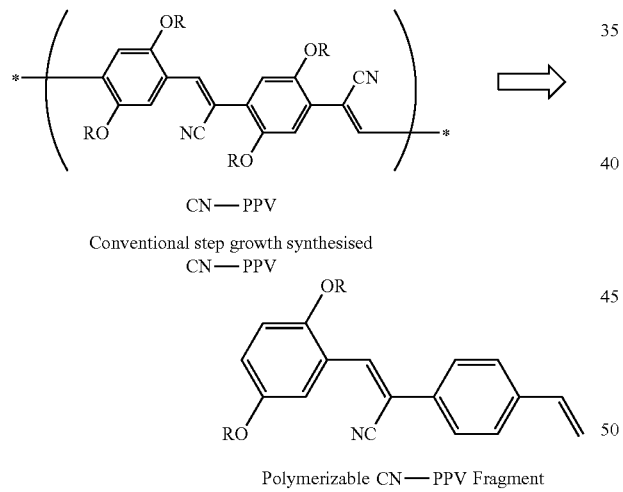

When polymerized the resultant polymer has pendant CN-PPV-type fragments as shown below.

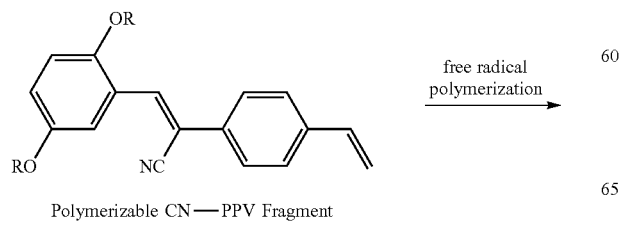

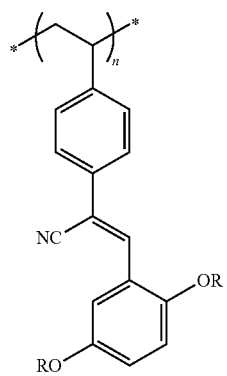

In this experiment two CN-PPV-type monomers (AG1-31 and AG1-78) were used to make homopolymers that could be used as the hole transport component in a polymeric light emitting device. The electrochemical determination of the HOMO and LUMO levels, and the investigation of their charge transport properties, through the successful use of one of them have been determined.

Monomers AG1-78 and AG1-31

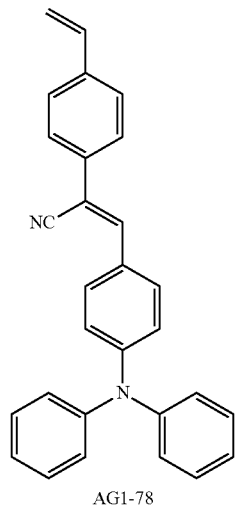

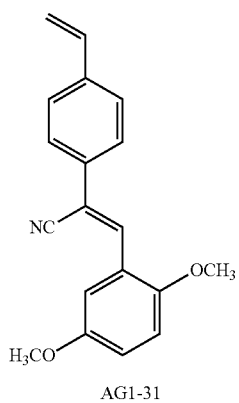

Monomer and Polymer Preparation

Monomers AG1-31 and AG1-78 were readily prepared through condensation of the commercially available aldehydes with vinyl benzylcyanide. Vinyl benzylcyanide itself is easily prepared from commercially available p-chloromethylstyrene as shown below:

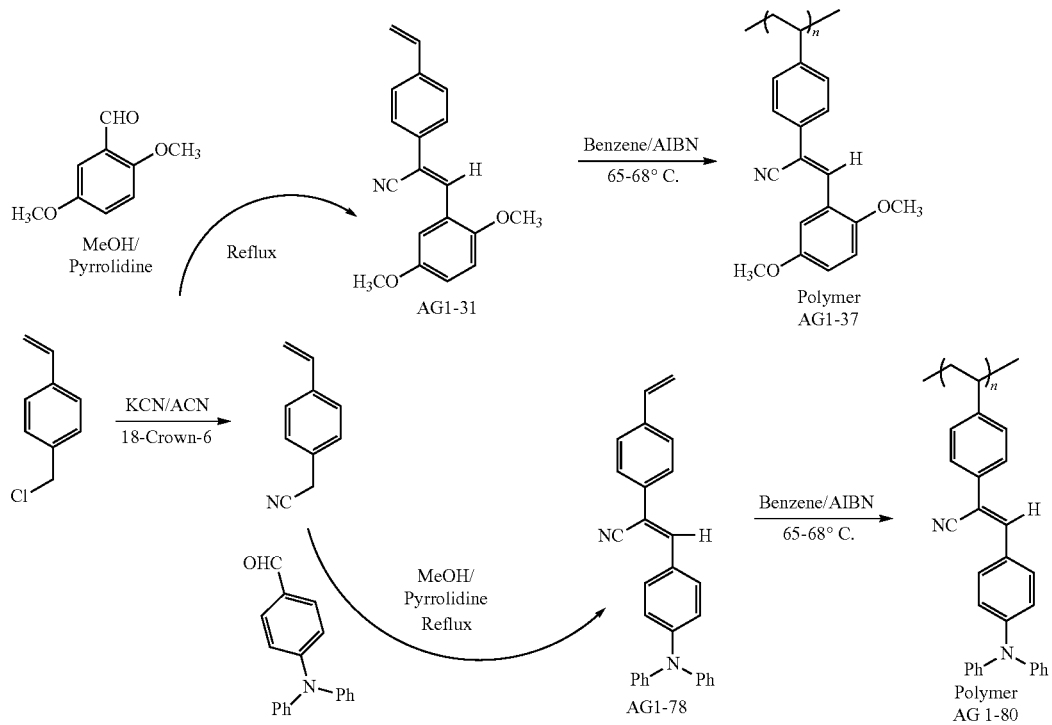

All the polymers were synthesized in the same fashion and with the same solvent and reaction conditions. Typically the monomer was dissolved in benzene, before the required quantity of AIBN was added and the solution degassed under high vacuum (to remove oxygen). The reaction mixture was stirred minimally under vacuum for 1-2 nights at 65-70° C. in an oil bath. Breaking the vacuum with nitrogen and subsequent TLC comparison with monomer and column purification enabled the isolation of pure polymers. The following describes the polymerisation of the two monomers in more detail.

AG1-80 (Z)-3-(4-(diphenylamino)phenyl)-2-(4-vinylphenyl)acrylonitrile

Step 1: Synthesis of Vinylbenzyl Cyanide

A mixture of vinylbenzyl chloride in acetonitrile (5.0 g, 0.033 mol, in 10 mL of ACN) was added to a mixture of potassium cyanide (1.5 ME, 0.0495 mol, 3.2 g), 18-Crown-6 ether (0.52 g) and acetonitrile (15 mL). The resulting mixture was stirred overnight at room temperature. TLC analysis (hexane:ethyl acetate, 8:2) indicated that the reaction had gone to completion. The reaction was worked up by adding water to the reaction mixture (50 mL) and extracting the product into ethyl acetate. The organic layer was washed twice with water followed by brine solution. The organic layer was dried on $Na_2SO_4$ and recovered under reduced pressure to obtain the required vinylbenzyl cyanide as a light brown coloured oil (4.2 g, 87.8%) which was used without further purification in the next step. $^1$H NMR (400 MHz, $CDCl_3$) δ3.7 (s, 2H), δ 5.3 (d, 1H, ethylene —CH trans), δ5.8 (d, 1H, ethylene-CH cis), δ 6.7 (m, 1H), δ 7.3 (Ar 2H, dd), δ 7.4 (Ar 2H, dd).

Step 2: Synthesis of AG1-78

Vinyl benzylcyanide (2.2 g, 0.0154 mol) was dissolved in methanol (10 mL) and 4-(diphenylamino)benzaldehyde (1 ME, 0.0154 mol, 4.2 g) was added, followed by the addition of pyrrolidine (1.5 ME, 0.0231 mol, 1.64 g, 1.9 mL). The resulting reaction mixture was heated at reflux overnight under argon. TLC analysis on the mixture (H:EA, 8.5:1.5) showed the formation of a yellow coloured product along with some unreacted vinyl benzylcyanide. The reaction mixture was purified by column chromatography (hexane:ethyl acetate, 8.5:1.5). After chromatography, the pure product, AG1-78, was obtained as a yellow colloured brightly fluorescent material solid (1.5 g, 23%), $^1$H NMR (400 MHz, $CDCl_3$) δ 5.3 (d, 1H, ethylene —CH), δ5.8 (d, 1H, ethylene-CH), δ 6.7 (m, 1H), δ 7.1 (m, 8H), δ 7.3 (m, 4H), δ 7.45 (m, 3H), δ 7.6 (dd, 2H), δ 7.7 (dd, 2H), $^{13}$C NMR ($CDCl_3$, ppm, δ): 149.94, 146.60, 141.18, 137.85, 135.97, 134.34, 130.66, 129.56, 126.75, 126.44, 125.78, 125.70, 124.37, 120.89, 118.66, 114.81, 107.38.

Synthesis of Polymer AG1-80

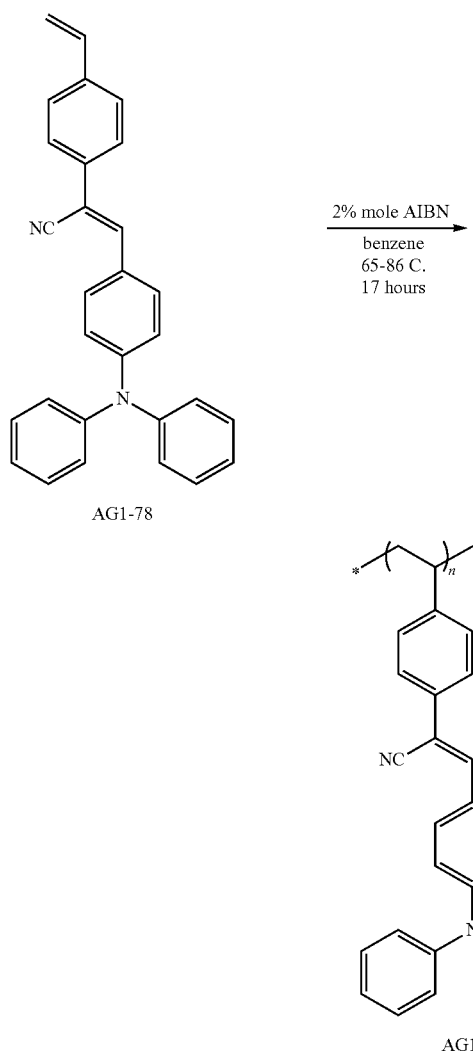

Monomer AG1-78 (500 mg) and AIBN (2% molar equivalents) were taken in a polymerization flask, benzene (2.5 mL) was added and the resulting solution was degassed (freeze-pump-thaw) 4-5 times. The reaction mixture was stirred at 65-70° C. (oil bath temp.) overnight. TLC analysis (hexane: ethyl acetate, 7:3) revealed a baseline polymer spot and unreacted monomer. The polymer was purified by column chromatography. After chromatography the pure polymer (60 mg) was obtained as a yellow coloured compound which was highly fluorescent when irradiated with 365 nm light. $^1$H NMR analysis of the product revealed only broad signals in the aromatic region; there was no indication of any un-reacted monomer.

Energy Level Determinations

HOMO and LUMO levels of the polymers were determined using cyclic voltametry (of films of the polymers on a glassy carbon electrode) and UV-Vis spectroscopy, these data are summarised in Table 3:

TABLE 3

Spectroscopic properties of polymeric AG1-80 and AG1-37

| Polymer | Appearance when irradiated at 365 nm | Absorbance Onset/ λmax (nm) | Fluorescence λmax (nm) | Band Gap ΔE (eV) |
|---|---|---|---|---|
| AG1-80 | Fluorescence (Bright Golden) | 480/406 | 510 | 2.6 |
| AG1-37 | Fluorescence (Bright Yellow) | 443/ 304 & 360 | 470 | 2.8 |

Figure 4:
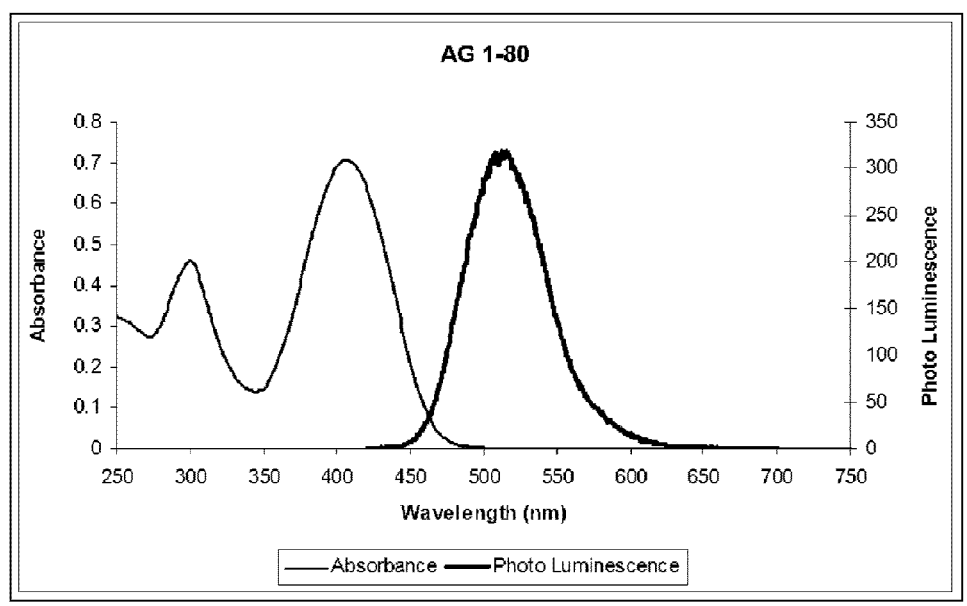
FIG. 4 shows UV-Vis and photoluminescence Data for polymeric AG 1-80 in dichloromethane.

UV-Vis and photoluminescence Data for polymeric AG 1-80 in dichloromethane is shown in FIG. 4.

Figure 5:
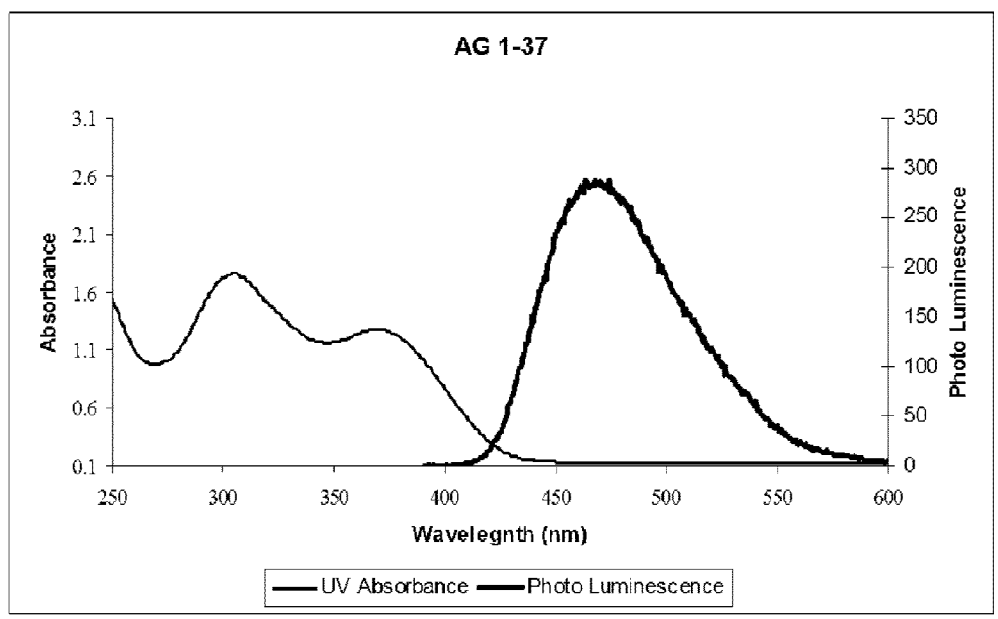
FIG. 5 shows UV-Vis and photoluminescence Data for polymeric AG 1-37 in dichloromethane.

UV-Vis and photoluminescence Data for polymeric AG 1-37 in dichloromethane is shown in FIG. 5.

The polymers were analysed by cyclic voltametry. As films on glassy carbon electrodes only oxidation events were visible within the solvent window. The onset of the oxidation events were used to determine the HOMO energy levels of the two polymers. LUMO energy levels were calculated by adding the spectroscopically determined HOMO-LUMO gap (estimated from the onset of the UV-Vis absorption band) to the HOMO level, Table 4.

TABLE 4
HOMO and LUMO energy levels for polymeric AG1-80 and AG1-37
| Polymer | HOMO (eV) | LUMO (eV) |
|---|---|---|
| AG1-80 | −5.1 | −2.5 |
| AG1-37 | −5.6 | −2.8 |
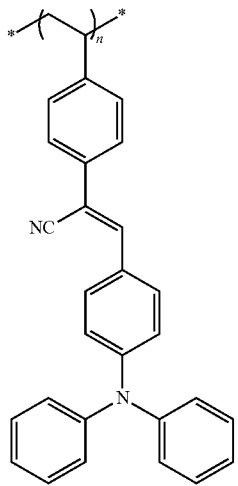
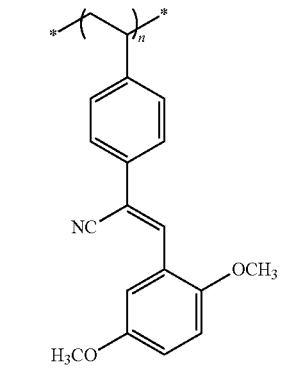
Example 23
Monomers AG1-31 and AG1-78 are polymerised under the control of the poly(3-hexylthiophene) RAFT agent as shown below:
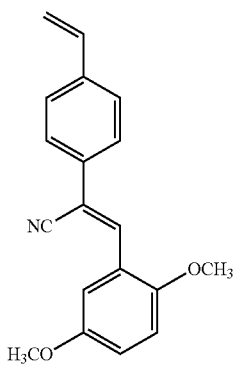
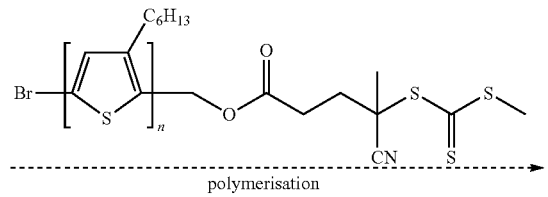
polymerisation
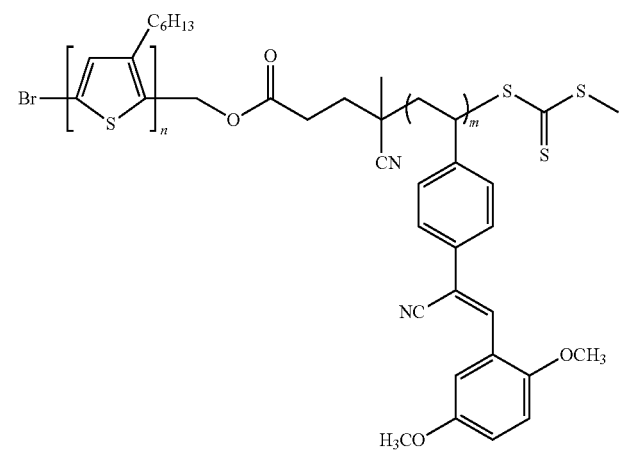

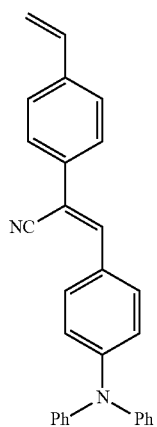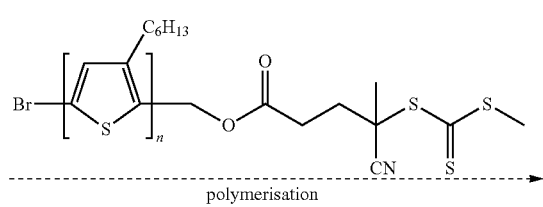

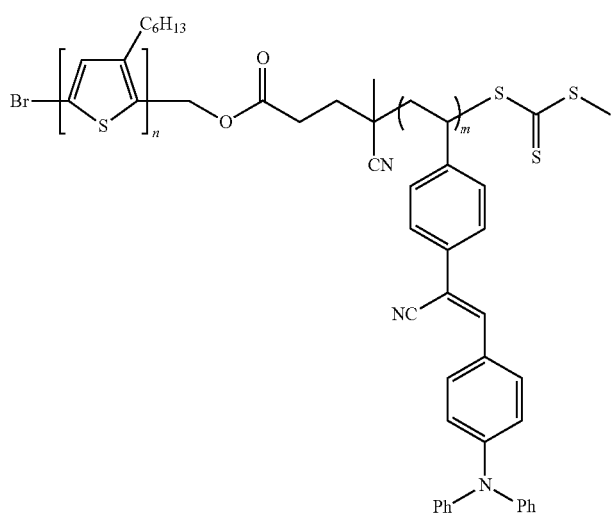

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps.

The invention claimed is:

1. A macro-RAFT agent for polymerising one or more ethylenically unsaturated monomers by RAFT polymerisation, the macro-RAFT agent having a conducting or semiconducting segment coupled to a RAFT functional group, wherein the leaving group of the macro-RAFT agent comprises the conducting or semiconducting segment, and wherein the RAFT functional group is selected from trithiocarbonate, dithiocarbonate and dithioester.

2. The macro-RAFT agent according to claim 1, wherein the conducting or semiconducting segment is a terminal segment of the macro-RAFT agent.

3. The macro-RAFT agent according to claim 1, which is represented by formula (IV):

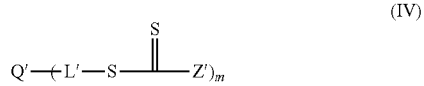

wherein:
m is a positive integer;
Q' is an m-valent conducting or semiconducting segment;
L' is a covalent bond or a linking group; and
Z' is a group that (a) provides for the trithiocarbonate, dithiocarbonate or dithioester RAFT functional group, and (b) allows the compound to function as a macro-RAFT agent in the polymerisation of one or more ethylenically unsaturated monomers.

4. The macro-RAFT agent according to claim 3, wherein 1≤m≤100.

5. The macro-RAFT agent according to claim 3, wherein m=1.

6. The macro-RAFT agent according to claim 3, wherein the Z' group comprises a conducting or semiconducting segment.

7. The macro-RAFT agent according to claim 3, which is represented by formula (V):

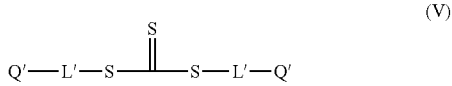

wherein Q' and L' are as defined in claim 3.

8. The macro-RAFT agent according to claim 1, wherein the conducting or semiconducting segment comprises at least 4 structural repeat units.

9. The macro-RAFT agent according to claim 1, wherein the conducting or semiconducting segment comprises at least 7 structural repeat units.

10. The macro-RAFT agent according to claim 1, wherein the conducting or semiconducting segment comprises at least 10 structural repeat units.

11. The macro-RAFT agent according to claim 1, wherein the or each ethylenically unsaturated monomer is selected from those of general formula (III):

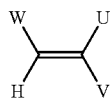
(III)

wherein:
U and W are independently selected from —CO$_2$H, —CO$_2$R$^2$, —COR$^2$, —CSR$^2$, —CSOR$^2$, —COSR$^2$, —CONH$_2$, —CONHR$^2$, —CONR$^2{}_2$, hydrogen, halogen and optionally substituted C$_1$-C$_4$ alkyl;

V is selected from the group consisting of hydrogen, R$^2$, —CO$_2$H, —CO$_2$R$^2$, —COR$^2$, CN, —CSR$^2$, —CSOR$^2$, —COSR$^2$, —CONH$_2$, —CONHR$^2$, —CONR$^2{}_2$, NHC(O)R$^2$, NR$^2$C(O)R$^2$, PO(OR$^2$)$_3$, —OR$^2$, —SR$^2$, —O$_2$CR$^2$, —SCOR$^2$, —OCSR$^2$ and halogen; and wherein the or each R$^2$ is independently selected from optionally substituted C$_1$-C$_{22}$ alkyl, optionally substituted C$_2$-C$_{22}$ alkenyl, C$_2$-C$_{22}$ optionally substituted alkynyl, optionally substituted aryl, optionally substituted heteroaryl, optionally substituted carbocyclyl, optionally substituted heterocyclyl, optionally substituted aralkyl, optionally substituted heteroarylalkyl, optionally substituted alkaryl, optionally substituted alkylheteroaryl and polymer chains.

12. The macro-RAFT agent according to claim 11, wherein R$^2$ is a phenyl group substituted with one of the following groups:

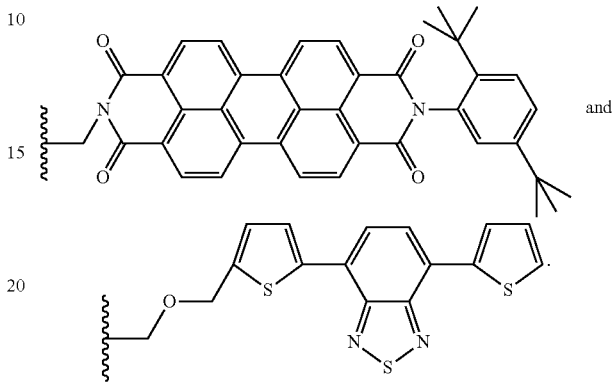

and

* * * * *